(12) United States Patent
Sun et al.

(10) Patent No.: US 12,520,544 B2
(45) Date of Patent: Jan. 6, 2026

(54) METHOD FOR FORMING NANOSTRUCTURE AND FIELD EFFECT TRANSISTOR DEVICE ON A SUBSTRATE

(71) Applicant: PEKING UNIVERSITY, Beijing (CN)

(72) Inventors: Wei Sun, Beijing (CN); Mengyu Zhao, Beijing (CN)

(73) Assignee: PEKING UNIVERSITY, Beijing (CN)

( * ) Notice: Subject to any disclaimer, the term of this patent is extended or adjusted under 35 U.S.C. 154(b) by 564 days.

(21) Appl. No.: 17/916,050

(22) PCT Filed: Mar. 30, 2021

(86) PCT No.: PCT/CN2021/083939
§ 371 (c)(1),
(2) Date: Sep. 30, 2022

(87) PCT Pub. No.: WO2021/197321
PCT Pub. Date: Oct. 7, 2021

(65) Prior Publication Data
US 2023/0180591 A1 Jun. 8, 2023

(30) Foreign Application Priority Data

Mar. 31, 2020 (WO) ................ PCT/CN2020/082375
Mar. 31, 2020 (WO) ................ PCT/CN2020/082377
(Continued)

(51) Int. Cl.
*H10K 71/12* (2023.01)
*G03F 7/16* (2006.01)
(Continued)

(52) U.S. Cl.
CPC ........... *H10D 62/119* (2025.01); *G03F 7/162* (2013.01); *H10D 30/014* (2025.01); *H10D 30/43* (2025.01);
(Continued)

(58) Field of Classification Search
CPC .... H10D 62/119; H10D 30/014; H10D 30/43; H10K 85/221; H10K 71/12; H10K 10/464; H10K 10/484; G03F 7/162
See application file for complete search history.

(56) References Cited

U.S. PATENT DOCUMENTS

2009/0242405 A1 10/2009 Clark et al.
2010/0155696 A1 6/2010 Duan et al.
(Continued)

FOREIGN PATENT DOCUMENTS

| CN | 1921153 A | 2/2007 |
| CN | 101971354 A | 2/2011 |

(Continued)

OTHER PUBLICATIONS

Office Action of Taiwanese application No. 110111696, issued on Jan. 3, 2025.
(Continued)

*Primary Examiner* — Victor A Mandala
*Assistant Examiner* — Colleen E Snow
(74) *Attorney, Agent, or Firm* — Junhe Law Office P.C.; Zhaohui Wang

(57) ABSTRACT

A method for forming a nanostructure array and a field effect transistor device on a substrate are provided. The method for forming the nanostructure array includes: providing a template solution comprising template nanostructures; depositing at least one template nanostructure onto the substrate by contacting the template solution with the substrate; and forming on the substrate at least one fixation structure each intersecting with all or a portion of the at least one template nanostructure to fix all or a portion of the at least one template nanostructure on the substrate.

30 Claims, 30 Drawing Sheets (a)

(b)

(30) Foreign Application Priority Data

Apr. 1, 2020 (WO) ............... PCT/CN2020/082777
Apr. 1, 2020 (WO) ............... PCT/CN2020/082778

(51) Int. Cl.

| | |
|---|---|
| H10D 30/01 | (2025.01) |
| H10D 30/43 | (2025.01) |
| H10D 62/10 | (2025.01) |
| H10K 10/46 | (2023.01) |
| H10K 85/20 | (2023.01) |
| B82Y 5/00 | (2011.01) |
| B82Y 40/00 | (2011.01) |

(52) U.S. Cl.
CPC ......... *H10K 10/464* (2023.02); *H10K 10/484* (2023.02); *H10K 71/12* (2023.02); *H10K 85/221* (2023.02); *B82Y 5/00* (2013.01); *B82Y 40/00* (2013.01)

(56) References Cited

U.S. PATENT DOCUMENTS

| | | |
|---|---|---|
| 2011/0011773 A1 | 1/2011 | Strano et al. |
| 2017/0190573 A1 | 7/2017 | Shen et al. |
| 2023/0115797 A1* | 4/2023 | Goldsmith ......... G01N 27/4146 257/253 |

FOREIGN PATENT DOCUMENTS

| | | |
|---|---|---|
| CN | 105085961 A | 11/2015 |
| JP | 2009528254 A | 8/2009 |
| JP | 2010525527 A | 7/2010 |
| JP | 2011101047 A | 5/2011 |
| JP | 2012222019 A | 11/2012 |
| KR | 20100017129 A | 2/2010 |
| WO | 2009017852 A2 | 2/2009 |
| WO | 2012061514 A1 | 5/2012 |

OTHER PUBLICATIONS

Office Action of Japanese application No. 2022-559514, issued on Feb. 5, 2025.
Patrick Nickels et al: "Polyaniline nanowire synthesis templated by DNA", Nanotechnology, Institute of Physics Publishing, Bristol, GB, vol. 15, No. 11, Sep. 10, 2004, pp. 1524-1529.
Lu J et al: "DNA-templated photo-induced silver nanowires: Fabrication and use in detection of relative humidity", Biophysical Chemistry, Elsevier, Amsterdam, NL, vol. 145, No. 2-3, Sep. 21, 2009, pp. 91-97.
Extended European Search Report of European application No. 21781342.7, issued on Apr. 2, 2024.
International Search Report of PCT/CN2021/083939, mailed on Jul. 5, 2021.
The International Technology Roadmap for Semiconductors: 2013.
G. Hills et al., Understanding energy efficiency benefits of carbon nanotube field-effect transistors for digital VLSI, IEEE Trans. Nanotech. 17, 1259-1269 (2018).
Q. Cao et al., Arrays of single-walled carbon nanotubes with full surface overage for high-performance electronics, Nature Nanotech. 8, 180-186 (2013).
G. J. Brady, K. R. Jinkins, M. S. Arnold, Channel length scaling behavior in transistors based on individual versus dense arrays of carbon nanotubes, J. Appl. Phys. 122, 124506 (2017).
G. J. Brady et al., Quasi-ballistic carbon nanotube array transistors with current density exceeding Si and GaAs, Sci. Adv. 2, e1601240 (2016).
Q. Cao, J. Tersoff, D. B. Farmer, Y. Zhu, S.-J. Han, Carbon nanotube transistors scaled to a 40-nanometer footprint, Science 356, 1369-1372 (2017).

H. A. Becerril, A.T.Woolley, DNA-templated nanofabrication, Chem. Soc. Rev. 38, 329-337 (2009).
M. R. Jones, N. C. Seeman, C. A. Mirkin, Programmable materials and the nature of the DNA bond, Science 347, 1260901 (2015).
S.-P. Han, H. T. Maune, R. D. Barish, M. Bockrath, W. A. Goddard, III, DNA-linker-induced surface assembly of ultra dense parallel single walled carbon nanotube arrays, Nano Lett. 12, 1129-1135 (2012).
A. Mangalum, M. Rahman, M. L. Norton, Site-specific immobilization of single-walled carbon nanotubes onto single and one-dimensional DNA origami, J. Am. Chem. Soc. 135, 2451-2454 (2013).
H. Pei et al., Organizing end-site-specific SWCNTs in specific loci using DNA, J. Am. Chem. Soc. 141, 11923-11928 (2019).
W. Sun et al., Precise pitch-scaling of carbon nanotube arrays within three-dimensional DNA nanotrenches, Science 368, 874-877 (2020).
H. T. Maune et al., Self-assembly of carbon nanotubes into two-dimensional geometries using DNA origami templates, Nature Nanotech. 5, 61-66 (2010).
K. Keren, R. S. Berman, E. Buchstab, U. Sivan, E. Braun, DNA-templated carbon nanotube field-effect transistor, Science 302, 1380-1382 (2003).
S.-J. Han et al., High-speed logic integrated circuits with solution-processed self-assembled carbon nanotubes, Nature Nanotech. 12, 861-865 (2017).
D. Zhong et al., Gigahertz integrated circuits based on carbon nanotube films, Nature Electron. 1, 40-45 (2018).
C. Zhao et al., Exploring the performance limit of carbon nanotube network film field-effect transistors for digital Integrated circuit applications, Adv. Funct. Mater. 29, 1808574 (2019).
Liu et al., Carbon nanotube complementary gigahertz integrated circuits and their applications on wireless sensor Interface systems, ACS Nano 13, 2526-2535 (2019).
A. M. Hung et al., Large-area spatially ordered arrays of gold nanoparticles directed by lithographically confined DNA origami, Nature Nanotech. 5, 121-126 (2010).
N. Nakatsuka et al., Aptamer-field-effect transistors overcome Debye length limitations for small-molecule sensing, Science 362, 319-324 (2018).
F. Zhou et al., Programmably shaped carbon nanostructure from shape-conserving carbonization of DNA, ACS Nano 10, 3069-3077 (2016).
Q. Cao, S.-J. Han, G. S. Tulevski, Fringing-field dielectrophoretic assembly of ultrahigh-density semiconducting nanotube arrays with a self-limited pitch, Nature Commun. 5, 5071 (2014).
J. Wu et al., Self-assembly of semiconducting single-walled carbon nanotubes into dense, aligned rafts, Small 9, 4142-4148 (2013).
Y. Cao et al., Radio frequency transistors using aligned semiconducting carbon nanotubes with current-gain cutoff frequency and maximum oscillation frequency simultaneously greater than 70 Ghz, ACS Nano 10, 6782-6790 (2016).
J. Wu, A. Antaris, M. Gong, H. Dai, Top-down patterning and self-assembly for regular arrays of semiconducting single-walled carbon nanotubes, Adv. Mater. 26, 6151-6156 (2014).
D. Lee et al., Three-dimensional fin-structured semiconducting carbon nanotube network transistor, ACS Nano 10, 10894-10900 (2016).
M. M. Shulaker et al., High-performance carbon nanotube field-effect transistors, IEEE Int. Electron Devices Meeting in San Francisco CA 33.6.1-33.6.4 (2014).
Y. Hu et al., Growth of high-density horizontally aligned SWNT arrays using Trojan catalysts, Nature Commun. 6, 6099 (2015).
L. Zhang et al., Assessment of chemically separated carbon nanotubes for nanoelectronics, J. Am. Chem. Soc. 130, 2686-2691 (2008).
L. Zhang et al., Optical characterizations and electronic devices of nearly pure (10,5) single-walled carbon nanotubes, J. Am. Chem. Soc. 131, 2454-2455 (2009).
A. Gopinath, P. W. K. Rothemund, Optimized assembly and covalent coupling of single-molecule DNA origami nanoarrays, ACS Nano 8, 12030-12040 (2014).
C. Qiu et al., Scaling carbon nanotube complementary transistors to 5-nm gate lengths, Science 355, 271-276 (2017).

(56) References Cited

OTHER PUBLICATIONS

L. Xiang et al., Low-power carbon nanotube-based integrated circuits that can be transferred to biological surfaces, Nature Electron. 1, 237-245 (2018).
C. Qiu et al., Dirac-source field-effect transistors as energy-efficient, high-performance electronic switches, Science 361, 387-392 (2018).
G. S. Tulevski et al., Toward high-performance digital logic technology with carbon nanotubes, ACS Nano 8, 8730-8745 (2014).
J. Zhang et al., Robust digital VLSI using carbon nanotubes, IEEE Transactions on Computer-Aided Design of Integrated Circuits and Systems 31, 453-471 (2012).
The First Office Action for the counterpart Chinese patent application 202180025955.0, mailed on May 24, 2025.
The Office Action for the counterpart Korean patent application 10-2022-7035738, mailed on Jun. 26, 2025.
Keren, K et al., "DNA-Templated Carbon Nanotube Field-Effect Transistor", Science, Nov. 21, 2003, vol. 302, No. 5649, p. 1380-1382.

\* cited by examiner

METHOD FOR FORMING NANOSTRUCTURE AND FIELD EFFECT TRANSISTOR DEVICE ON A SUBSTRATE

CROSS REFERENCE TO RELATED APPLICATIONS

The present application claims priority to the PCT Application No. PCT/CN2020/082375 filed on Mar. 31, 2020, the PCT Application No. PCT/CN2020/082377 filed on Mar. 31, 2020, the PCT Application No. PCT/CN2020/082778 filed on Apr. 1, 2020, and the PCT Application No. PCT/CN2020/082777 filed on Apr. 1, 2020, the entire contents of which are incorporated herein by reference.

TECHNICAL FIELD

The present application generally relates to nanofabrication technology, and more particularly, to a method for forming nanostructures and field effect transistor devices on a substrate.

BACKGROUND

In the projected high-performance energy-efficient field-effect transistors (FETs), evenly-spaced small-pitch (spacing between two adjacent channels within an individual FET) semiconductor channels are preferred. For example, at 5 nm technology node and beyond, a consistent 24-nm fin pitch has been suggested for the lithography-defined Fin-FETs. The smaller channel pitch leads to a higher integration density and on-state performance, on the risk of enhanced destructive short-range screening and electrostatic interactions; whereas the evenly-spaced alignment minimizes channel disorder that impacts the switching between on and off states.

While conventional lithography successfully scales down the channel pitch of bulk materials (e.g. silicon substrates), the performance drops for patterning one-dimensional (1D) semiconductors at sub-5 nm technology nodes. The projected channel pitches (~10 nm or less) for carbon nanotubes (CNTs) are beyond the fabrication limit of current lithography (larger than 10 nm). Alternatively, thin-film approaches, which use physical forces, or chemical recognitions to assemble CNTs, provide a density exceeding 500 CNTs/μm and on-state performance comparable with silicon-based FETs. However, the accompanying assembly disorders, including crossing, bundling and irregular pitches, inevitably degrade the gate modulation, displaying subthreshold swing as large as 500 mV/dec and reduced on/off ratio.

Therefore, there is a need for further improvement of the current nanofabrication technology.

SUMMARY

An objective of the present application is to provide a method for forming a nanostructure array on a substrate and a method for forming a field effect transistor (FET) array on a substrate.

In an aspect of the present application, a method for forming a nanostructure array on a substrate is provided. The method may include: providing a template solution including template nanostructures; depositing at least one template nanostructure onto the substrate by contacting the template solution with the substrate; and forming on the substrate at least one fixation structure each intersecting with all or a portion of the at least one template nanostructure to fix all or a portion of the at least one template nanostructure on the substrate.

In some embodiments, the template nanostructures include one or more substances selected from the group consisting of nucleic acid templates, decorated nucleic acid templates, protein templates, polymer templates, carbon nanotubes (CNTs), polymer-wrapped CNTs, CNT films, semiconductor nanoparticles, semiconductor nanowires, semiconductor nano-bricks, metal nanoparticles, metal nanowires, metal nano-bricks, polymeric nanoparticles, polymeric nanowires, polymeric nano-bricks, ceramic nanoparticles, ceramic nanowires, ceramic nano-bricks, metal oxide nanoparticles, metal oxide nanowires, metal oxide nano-bricks, fluoride nanoparticles, fluoride nanowires and fluoride nano-bricks.

In some embodiments, the template nanostructures include decorated nucleic acid template nanostructures each decorated with at least one nano-moiety, and providing a template solution including template nanostructures includes: forming nucleic acid template nanostructures in the template solution, each of the nucleic acid template nanostructures including at least one cavity region and a non-cavity region outside of the at least one cavity region; and mixing at least one nano-moiety with the template solution to assemble the at least one nano-moiety into at least one cavity region of the nucleic acid template nanostructures.

In some embodiments, the nucleic acid template nanostructures include deoxyribonucleic acid (DNA) nanostructures, ribonucleic acid (RNA) nanostructures, locked nucleic acid (LNA) nanostructures, or peptide nucleic acid (PNA) nanostructure.

In some embodiments, the nano-moiety includes one or more substances selected from the group consisting of carbon nanotubes (CNTs), polymer-wrapped CNTs, CNT films, semiconductor nanoparticles, semiconductor nanowires, semiconductor nano-bricks, metal nanoparticles, metal nanowires, metal nano-bricks, polymeric nanoparticles, polymeric nanowires, polymeric nano-bricks, ceramic nanoparticles, ceramic nanowires, ceramic nano-bricks, metal oxide nanoparticles, metal oxide nanowires, metal oxide nano-bricks, fluoride nanoparticles, fluoride nanowires and fluoride nano-bricks.

In some embodiments, the cavity region of the nucleic acid template nanostructure is formed with a first type nucleic acid brick, and the non-cavity region of the nucleic acid template nanostructure is formed with a second type nucleic acid brick which is different from the first type nucleic acid brick in nucleic acid sequence.

In some embodiments, forming nucleic acid template nanostructures in the template solution further includes: forming a first type nucleic acid handle on the at least one cavity region of the nucleic acid template nanostructure; and wherein assembling the at least one nano-moiety onto one of the nucleic acid template nanostructures further includes: forming a second type nucleic acid handle on the at least one nano-moiety; and assembling the at least one nano-moiety onto the at least one cavity region of the nucleic acid template nanostructure through interactions between the first type nucleic acid handle and the second type nucleic acid handle.

In some embodiments, the first type nucleic acid handle and the second type nucleic acid handle are complementary single-stranded nucleic acid strands.

In some embodiments, depositing the at least one template nanostructures onto the substrate includes: forming a patterned alignment layer on the substrate, wherein the patterned alignment layer includes a plurality of cavities; dipping the template solution containing the template nanostructures onto the patterned alignment layer; and incubating the substrate to diffuse the template nanostructures into the cavities.

In some embodiments, incubating the substrate includes: dehydrating or evaporating the substrate in a sealed chamber for a predetermined time period.

In some embodiments, the substrate includes a semiconductor, an oxide, a nitride, a metal, a polymer, or a graphene.

In some embodiments, the method may further include: etching the nucleic acid template nanostructures at their non-cavity regions.

In some embodiments, the nucleic acid template nanostructures are etched by carving nucleic acid strands which are complementary to nucleic acid strands at the non-cavity regions.

In some embodiments, etching the nucleic acid template nanostructures at their non-cavity regions includes: etching the nucleic acid template nanostructures to substantially even their top surfaces.

In some embodiments, before forming on the substrate at least one fixation structure, the method may further include: forming an intermediate layer on the substrate to promote adhesion of the fixation structure to the substrate.

In some embodiments, the at least one fixation structure have a thickness higher than 10 nm.

In some embodiments, the at least one fixation structure includes a dielectric material or a metallic material.

In some embodiments, the method may further include: removing at least a portion of the at least one nucleic acid template nanostructure.

In some embodiments, the removed portion of the at least one nucleic acid template nanostructure is not covered with the at least one fixation structure before the removal step.

In some embodiments, the at least a portion of the nucleic acid template nanostructure is removed by a rinsing process, a thermal annealing process or a chemical oxidation process.

In some embodiments, the template nanostructure includes a first part for forming an electronic device and a second part which is different from the first part in material, and the method further comprises: removing at least a portion of the second part of the template nanostructure.

In some embodiments, the method may further include: forming a field effect transistor (FET) array, a sensor array, a memory unit array, or a quantum device array based on the at least one template nanostructure fixed on the substrate.

In another aspect of the present application, a method for forming a field effect transistor (FET) device on a substrate is provided. The method may include: providing a template solution containing nucleic acid template nanostructures, wherein the nucleic acid template nanostructures are decorated with at least one nanowire; depositing at least one nucleic acid template nanostructure decorated with the at least one nanowire onto the substrate by contacting the template solution with the substrate; forming on the substrate at least one fixation structure each intersecting with all or a portion of the at least one nanowire to fix all or the portion of the at least one nanowire on the substrate; removing at least a portion of the at least one nucleic acid template nanostructure which is not covered with the at least one fixation structure; forming on the substrate a source contact and a drain contact along the at least one nanowire; and forming a gate structure between the source contact and the drain contact and along the at least one nanowire.

In some embodiments, providing a solution containing nucleic acid template nanostructures comprises: forming nucleic acid template nanostructures in a template solution; mixing at least one nanowire with the template solution to assemble the at least one nanowire onto the nucleic acid template nanostructures.

In some embodiments, each of the nucleic acid template nanostructures includes at least one cavity region and a non-cavity region outside of the at least one cavity region, and the at least one nanowire is assembled into at least one cavity region of the nucleic acid template nanostructures.

In some embodiments, the method may further include: etching the nucleic acid template nanostructures at their non-cavity regions to substantially even their top surfaces.

In some embodiments, the method may further include: removing the at least one fixation structure from the surface of the substrate.

In some embodiments, the nanowire includes a carbon nanotube or a semiconductor nanowire.

In yet another aspect of the present application, a field effect transistor (FET) device is provided. The FET may be formed by the method of the aforementioned aspect. The FET device may include: a substrate; a nucleic acid template-induced self-assembling nanowire formed on the substrate; at least one fixation structure formed on the substrate and intersecting with the nanowire; a source contact and a drain contact formed on the substrate; and a gate structure formed between the source contact and the drain contact along the nanowire.

The foregoing is an overview of the present application, which may simplify, summarize, and omit details. Those skilled in the art will appreciate that this section is merely illustrative and not intended to limit the scope of the present application in any way. This summary section is neither intended to identify key features or essential features of the claimed subject matter nor intended to act as an auxiliary means for determining the scope of the claimed subject matter.

BRIEF DESCRIPTION OF THE DRAWINGS

The drawings referenced herein form a part of the specification. Features shown in the drawing illustrate only some embodiments of the application, and not of all embodiments of the application, unless the detailed description explicitly indicates otherwise, and readers of the specification should not make implications to the contrary.

FIG. 8 (B) shows optical and SEM images for CNT-decorated DNA template nanostructures deposited on the substrate after liftoff of the photoresist layer according to an example of the present application; FIG. 8 (C) shows the statistics of counts (left axis) and cumulative percentage (right axis) for the aligned structures in FIG. 8 (B) at each specific orientation; and FIG. 8 (D) shows plot of angular distribution of the aligned arrays versus the lengths of the DNA brick crystal templates.

DETAILED DESCRIPTION OF THE PREFERRED EMBODIMENTS

Figure 1:
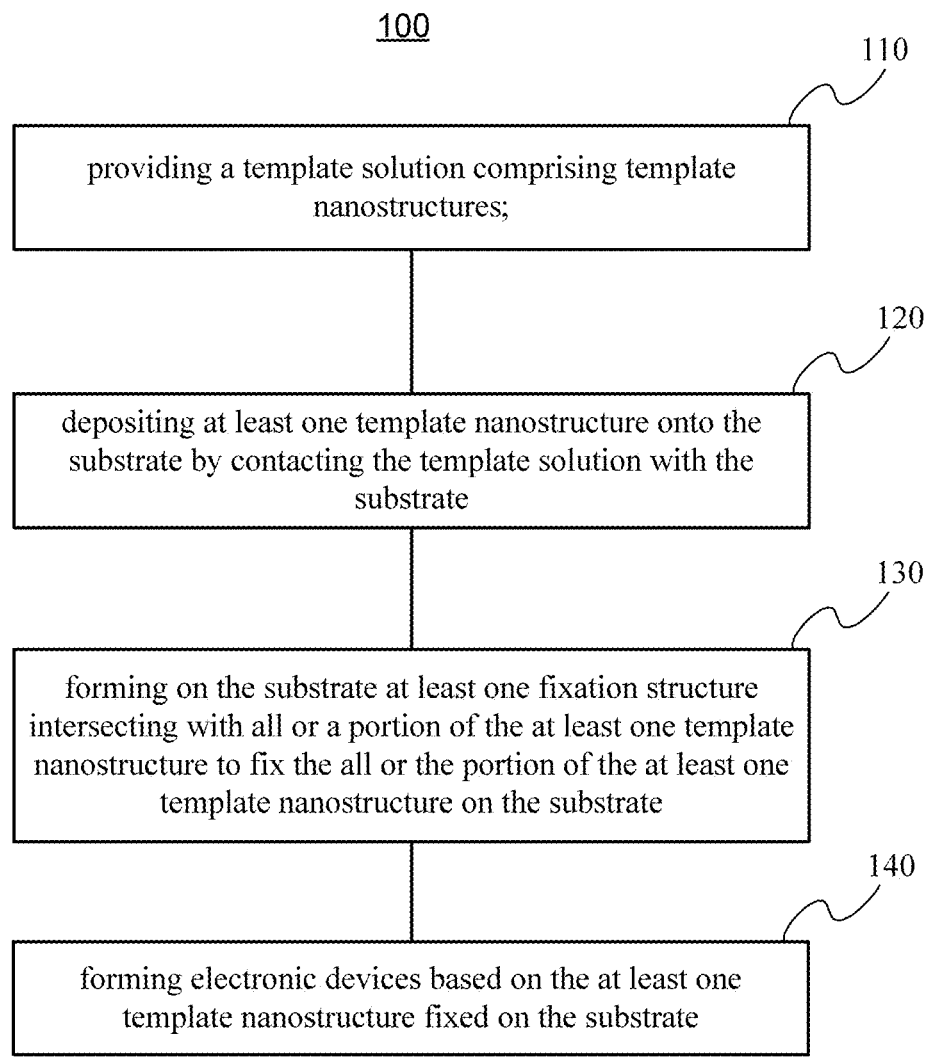
FIG. 1 illustrates a flow chart of a method for forming a nanostructure array on a substrate according to an embodiment of the present application.

The following detailed description of exemplary embodiments of the application refers to the accompanying drawings that form a part of the description. The drawings illustrate specific exemplary embodiments in which the application may be practiced. The drawings are not intended to be drawn to scale. For purposes of clarity, not every component may be labeled in every drawing. The detailed description, including the drawings, describes these embodiments in sufficient detail to enable those skilled in the art to practice the application. Those skilled in the art may further utilize other embodiments of the application, and make logical, mechanical, and other changes without departing from the spirit or scope of the application. Readers of the following detailed description should, therefore, not interpret the description in a limiting sense, and only the appended claims define the scope of the embodiment of the application.

In this application, the use of the singular includes the plural unless specifically stated otherwise. In this application, the use of "or" means "and/or" unless stated otherwise. Furthermore, the use of the term "including" as well as other forms such as "includes" and "included" is not limiting. In addition, terms such as "element" or "component" encompass both elements and components comprising one unit, and elements and components that comprise more than one subunit, unless specifically stated otherwise. Additionally, the section headings used herein are for organizational purposes only, and are not to be construed as limiting the subject matter described.

It has been found that using biological entities (such as bio-molecules and living organisms) to organize functional materials, i.e. bio-fabrication, may enable a fabrication resolution beyond current lithography limit. In particular, self-assembled deoxyribonucleic acid (DNA) structures have templated diverse shape-specific materials, including oxides, graphene, plasmonics, polymers, CNTs, and metallic interconnects. Despite these demonstrations, constructing high-performance FETs from bio-fabrication remains a challenge. Besides typical assembly disorders, contaminations surrounding the assembled semiconductors and other materials further deteriorate transport performance of the FETs. Meanwhile, wide orientation distributions during the surface placement of bio-templated materials prevent large-scale alignment of bio-fabrication.

Embodiments of the present application present a missing bridge between the nanometer-precision bio-molecular self-assembly and the solid-state high-performance electronics. By using self-assembled dense nucleic acid (e.g. DNAs) nano-trenches to fix and confine the DNA hybridization-mediated CNT alignment, a Spatially Hindered Integration of Nanotube Electronics (SHINE) is developed for building evenly-spaced CNT arrays. Programming the DNA trenches periodicity rationally scales the inter-CNT pitch beyond current lithography limit. And the pitch precision, indicative of array uniformity, improves compared to those prepared from thin-film approaches. Mis-aligned CNTs are repelled from the DNA nano-trenches due to electrostatic repulsion. A rinsing-after-fixing approach is further introduced to remove the DNA templates without degrading CNT alignment. Based on the uniform inter-CNT pitch and clean channel interface, solid-state multi-channel PMOS (p-channel metal-oxide-semiconductor) CNT FETs are constructed, displaying high on-state performance and fast on/off switching simultaneously. Using lithography-defined PMMA cavities to spatially confine the placement of the CNT-decorated fixed-width DNA templates, aligned arrays with prescribed geometries over centimeter-scale silicon substrate are demonstrated. Using SHINE, addressable bio-fabrication from DNAs, RNAs and proteins may direct the centimeter-scale assembly of electronic materials into designer devices at single-molecule resolution. Building high-performance ultra-scaled devices at the biology-electronics interface may thus enable diverse applications in the future post-Si era, such as multiplexed bio-molecular sensors and 3D FETs/memories, or various types of mechanical, optical or magnetic devices or structures at nano-scale resolution.

FIG. 1 illustrates a flow chart of a method 100 for forming a nanostructure array on a substrate according to an embodiment of the present application. The method 100 may include the following steps 110-140.

In Step 110, a template solution including template nanostructures is provided.

In some embodiments, the template nanostructures may include, without limitation, nucleic acid templates, decorated nucleic acid templates, protein templates, polymer templates, CNTs, polymer-wrapped CNTs, CNT films, semiconductor nanoparticles, semiconductor nanowires, semiconductor nano-bricks, metal nanoparticles, metal nanowires, metal nano-bricks, polymeric nanoparticles, polymeric nanowires, polymeric nano-bricks, ceramic nanoparticles, ceramic nanowires, ceramic nano-bricks, metal oxide nanoparticles, metal oxide nanowires, metal oxide nano-bricks, fluoride nanoparticles, fluoride nanowires and fluoride nano-bricks.

In some embodiments, the template nanostructures may include decorated nucleic acid template nanostructures. For example, the template nanostructures may be CNT-decorated nucleic acid template nanostructures, or gold nanorod-decorated nucleic acid template nanostructures.

In some embodiments, the template nanostructures are formed in the solution. In other embodiments, the template nanostructures are only mixed in the solution. The solution may vary according to the template nanostructures.

In Step 120, at least one template nanostructure is deposited onto the substrate by contacting the template solution with the substrate.

A substrate refers to a substance onto which another substance is applied. In some embodiments, the substrate may include, without limitation, silicon, silicon dioxide (also referred to as silica), aluminum oxide, sapphire, germanium, gallium arsenide (GaAs), an alloy of silicon and germanium, or indium phosphide (InP). In some embodiments, the substrates may include silicon nitride, carbon, and/or polymer. In some embodiments, the substrate may be inorganic or organic. In some embodiments, the substrate may include graphene and/or graphite. In some embodiments, the substrate comprises a metal, for example, aluminum, copper, or iron. In some embodiments, the substrate is a hybrid (e.g., includes a mixture) of any two or more materials (e.g., a hybrid of an inorganic material and an organic material, or a hybrid of two or more different inorganic materials or organic materials). For example, a substrate may include a mixture of inorganic and organic materials, a mixture of two or more different inorganic materials, or a mixture of two or more different organic materials. In some embodiments, a substrate includes a semiconductor material or a mixture of semiconductor materials. Semiconductor materials include, without limitation, Group IV elemental semiconductors, Group IV compound semiconductors, Group VI elemental semiconductors, Group III-V semiconductors, Group II-VI semiconductors, Group I-VII semiconductors, Group IV-VI semiconductors, Group IV-VI semiconductors, Group V-VI semiconductors, Group II-V semiconductors, oxides, layered semiconductors, magnetic semiconductors, organic semiconductors, charge-transfer complexes and combinations thereof.

In some embodiments, depositing template nanostructures onto the substrate may include: forming a patterned alignment layer having a plurality of cavities on the substrate and depositing the template nanostructures on the substrate to diffuse the template nanostructures into the plurality of cavities. Preferably, the substrate can be further incubated, such as by dehydrating or evaporating, to remove solvent from the substrate after the diffusing. In some embodiments, each cavity may be filled with one template nanostructure, and in some other embodiments, each cavity may be filled with one or more template nanostructures.

In some embodiments, the template nanostructures can be deposited on the substrate directly, without forming the patterned alignment layer with the plurality of cavities on the substrate.

More details about an exemplary process of depositing at least one template nanostructure onto the substrate can be found in the PCT application No. PCT/CN2020/082377 filed on Mar. 31, 2020 and entitled "method for depositing template nanostructures on a substrate and nanostructure arrays", and in the PCT application No. PCT/CN2020/082777 filed on Apr. 1, 2020 and entitled "method for depositing template nanostructures on a substrate and nanostructure arrays", the entire contents of which are incorporated by reference herein.

In Step 130, at least one fixation structure is formed on the substrate, and the at least one fixation structure intersects with all or a portion of the at least one template nanostructure to fix all or a portion of the at least one template nanostructure on the substrate.

In some embodiments, the fixation structure may include a dielectric material or a metallic material. It is desired that the material of the fixation structure for fixing the template nanostructure has relatively strong adhesion to the template nanostructure and the substrate. For example, the fixation structure may include Mo, Pd, Au, Ti, $SiO_2$, or $HfO_2$.

In some embodiments, before forming the fixation structure on the substrate, an intermediate layer is formed on the substrate to promote adhesion of the fixation structure to the substrate. The material of the intermediate layer may vary depending on the materials of the fixation structure and the substrate. For example, if the substrate is $SiO_2$, and the fixation structure is gold, a Cr or Ti intermediate layer may be formed therebetween to promote the adhesion. In some other embodiments, a metallization process, a salinization process or a chemical modification process may be performed on the surface of the substrate to promote its adhesion to the fixation structure.

In some embodiments, the fixation structure may have a thickness higher than 10 nm (for example, 20 nm, 50 nm, 100 nm, 150 nm, etc.) to avoid breaking down during rinsing or other harsh treatments.

In some embodiments, the fixation structure may be wider than the template nanostructure, such that there are enough surface contacts between the fixation structure and the substrate, which make the fixation structure stable on the surface of the substrate. For example, the fixation structure may be 20 nm, 50 nm, 80 nm, 100 nm wider than the template nanostructure.

In some embodiments, the fixation structure may have a rectangular shape. In some other embodiments, the fixation structure may have an oval shape, a trapezoid shape or other suitable shapes. In some embodiments, one, two or more fixation structures can be formed on the substrate to intersect a single template nanostructure at desired locations of the template nanostructure, depending on a dimension and shape of the template nanostructure. Moreover, two or more template nanostructures can share one or more fixation structures, depending on the positional relationship between the template nanostructures and the shape and size of the fixation structures.

Figure 2:
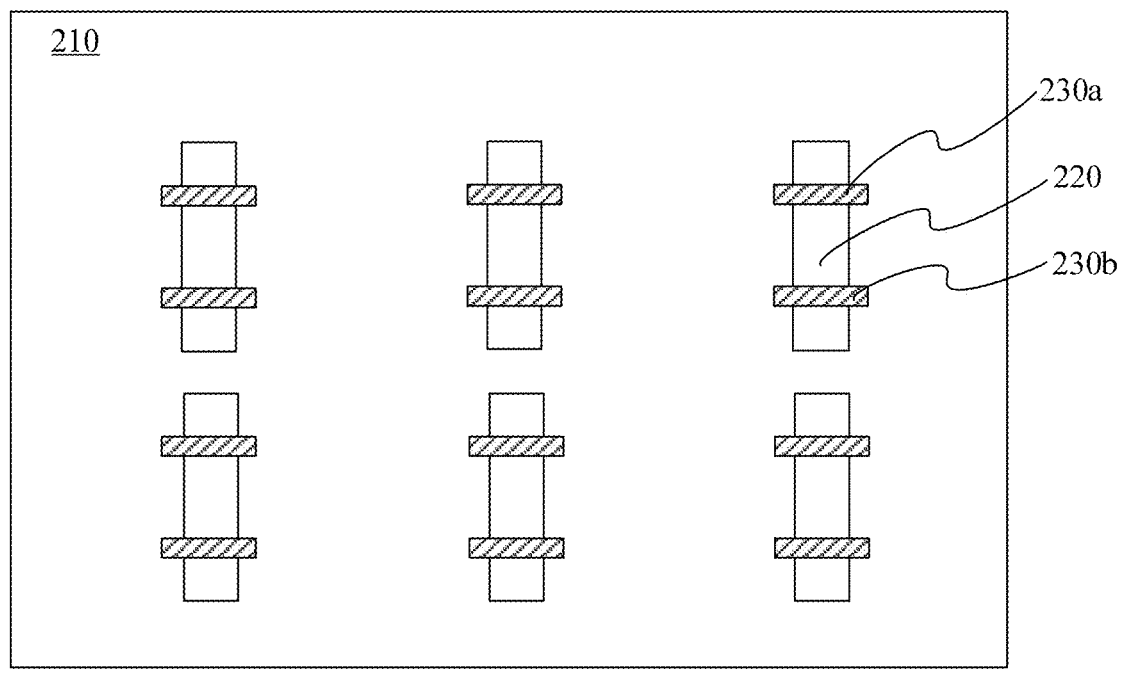
FIG. 2 illustrates an exemplary substrate after fixation structures are formed on the substrate.

FIG. 2 illustrates an exemplary substrate after the fixation structure is formed on the substrate. As shown in FIG. 2, a plurality of template nanostructures 220 are deposited on the substrate 210, and two rectangular fixation structures 230a and 230b are formed on each template nanostructure 220 to fix the template nanostructure 220 on the substrate 210.

In Step 140, one or more electronic devices are formed based on the at least one template nanostructure fixed on the substrate.

After the fixation structure is formed on the substrate, the template nanostructure is fixed on the substrate. Then, subsequent processes can be performed on the template nanostructures to form desired electronic devices. As the alignment quality of the template nanostructures can be retained by the fixation structures, the template nanostructures may not be perturbed during the subsequent processes. The electronic devices may be a FET array, a sensor array, a memory unit array, or a quantum device array.

In some embodiments, the template nanostructure may include a first part for forming the electronic device or other types of nanodevices and nanostructures and a second part which is different from the first part in material. In an example, the template nanostructure comprises an organic part (for example, bio-material, polymer material, etc.) and an inorganic part (for example, CNT, semiconductor material, metal material, a metal oxide material, etc.), and the electronic device is formed based on the inorganic part of the template nanostructure. In order to eliminate contaminations from the organic part, the method may further include a step of removing at least a portion of the organic part of the template nanostructure. The organic part of the template nanostructure can be removed by a rinsing process, a thermal annealing process or a chemical oxidation process. In other examples, the template nanostructure may have one or more organic parts or one or more inorganic parts, the above processes or other suitable processes may be performed to remove any one or more of these organic and inorganic parts. In a specific example, the template nanostructure is a polymer-wrapped CNT, including a polymer part and a CNT part, and a FET device can be formed based on the CNT part. In order to eliminate contaminations from the polymer, a rinsing process may be performed to remove the polymer from the CNT before forming the FET device.

It should be appreciated by those skilled in the art that various electronic devices or other nanodevices such as optical, magnetic or mechanical nanodevices can be formed based on different properties of the template nanostructures and/or their respective nano-moieties (as detailed below) fixed on the substrate. For example, when the template nanostructures fixed on the substrate are CNTs or semiconductor nanowires, FETs or memory units can be formed based on these CNTs or semiconductor nanowires. When the template nanostructures fixed on the substrate are gold nanorods, sensor devices can be formed based on these gold nanorods.

Figure 3:
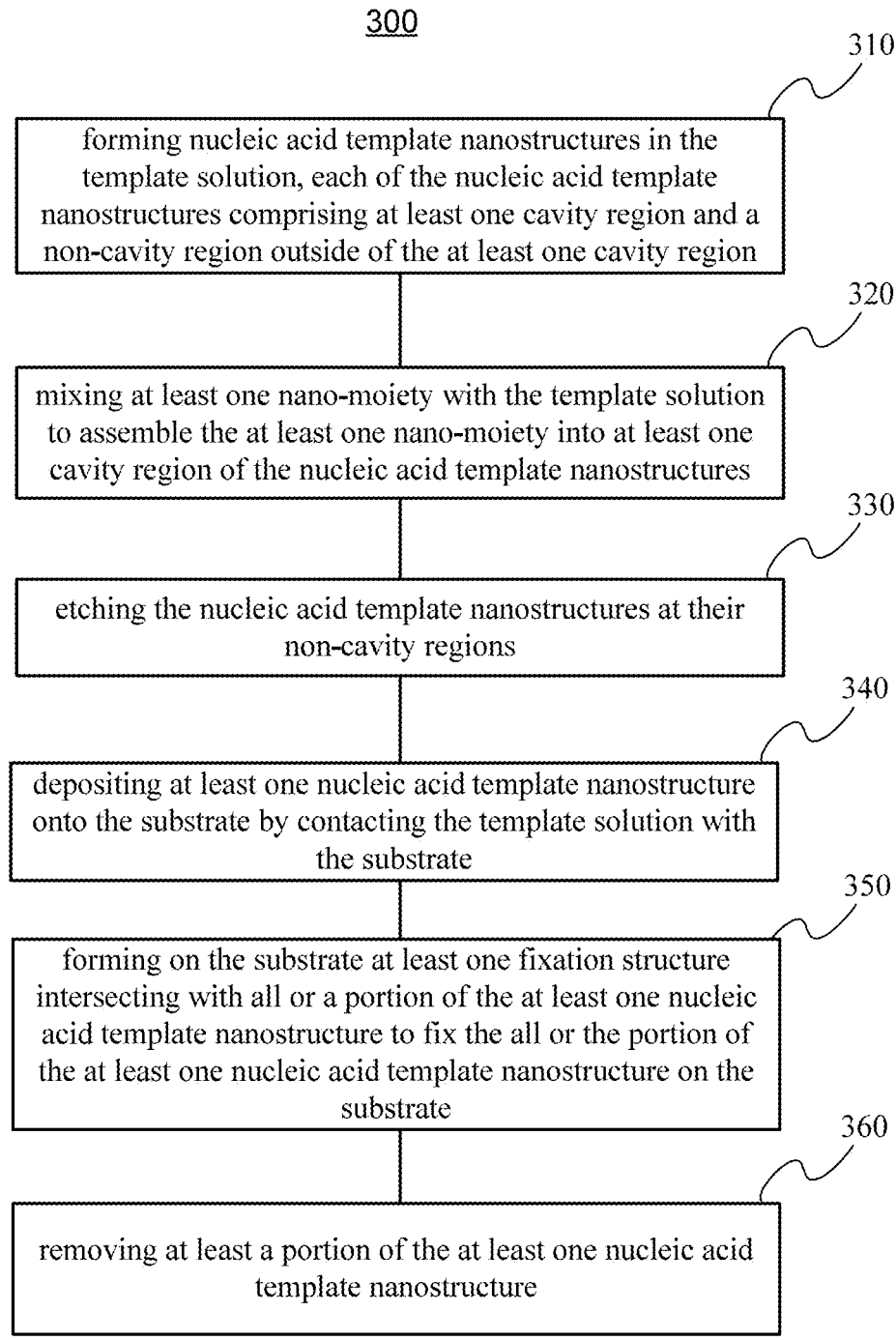
FIG. 3 illustrates a flow chart of a method for forming a nanostructure array on a substrate according to an embodiment of the present application.

FIG. 3 illustrates a flow chart of a method 300 for forming a nanostructure array a substrate according to an embodiment of the present application. The nanostructure array of the method 300 may be formed based on decorated nucleic acid template nanostructures fixed on the substrate. The method 300 may include the following steps 310-360.

In Step 310, nucleic acid template nanostructures are formed in a template solution. Each of the nucleic acid template nanostructures includes at least one cavity region and a non-cavity region outside of the at least one cavity region.

In some embodiments, the nucleic acid template nanostructure includes one or more deoxyribonucleic acid (DNA) nanostructures, one or more ribonucleic acid (RNA) nanostructures, one or more locked nucleic acid (LNA) nanostructures, one or more peptide nucleic acid (PNA) nanostructures, or the combination of any of these nanostructures.

In some embodiments, each cavity region of the nucleic acid template nanostructure may have a width of 1 nm to 1 µm (e.g. 10.6 nm, 12.7 nm, 16.8 nm, 24.1 nm, or 25.3 nm), and a length of 10 nm to 100 µm (e.g. 500 nm, 1.5 µm, 10 µm, or 20 µm). The cavity regions may have the same dimensions or different dimensions, and the non-cavity regions may also have the same dimensions or different dimensions.

Figure 4:
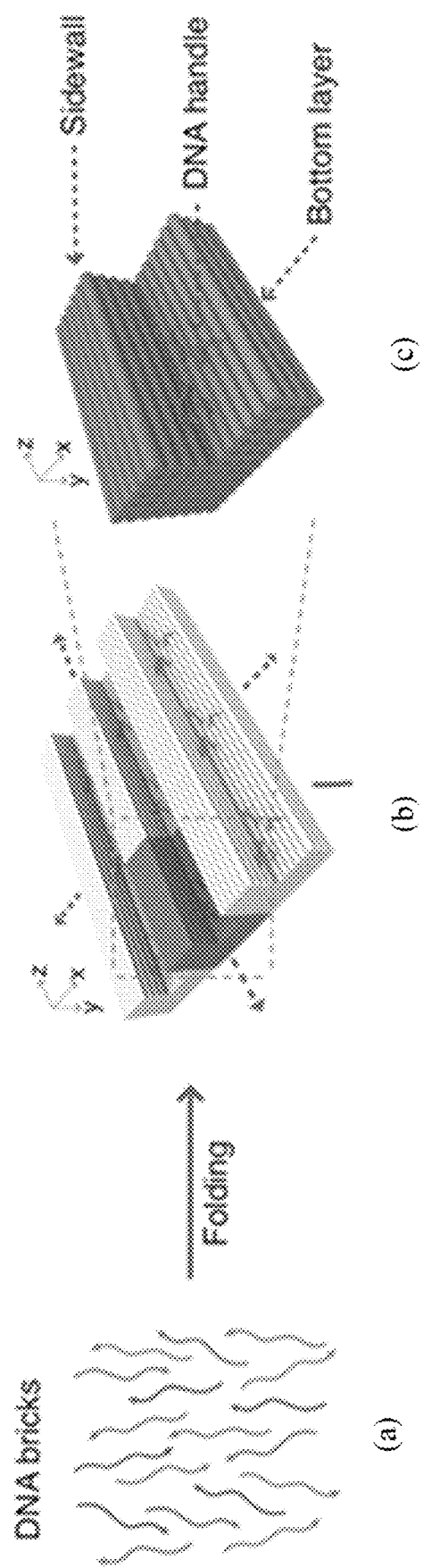
FIGS. 4(a) to 4(c) illustrate a process for forming a nucleic acid template nanostructure according to an embodiment of the present application.

In some embodiment, the nucleic acid template nanostructure is formed with nucleic acid bricks, which can be modelled as a Lego-like brick (Y Ke et al., DNA brick crystals with prescribed depths, *Nature Chem.* 6, 994-1002 (2014), incorporated by reference herein). FIGS. 4(a)-4(c) illustrate an exemplary process for forming the nucleic acid template nanostructure. FIG. 4 (a) illustrates DNA bricks used for forming the nucleic acid template nanostructure. FIG. 4 (b) illustrates the nucleic acid template nanostructure which includes a plurality of cavity regions (also referred to as "trench") and a plurality of non-cavity regions (also referred to as "sidewall") outside of the cavity regions. Each trench of the nucleic acid template nanostructure is formed with first-type DNA brick(s), and each sidewall of the nucleic acid template nanostructure is formed with second-type DNA brick(s) which is different in nucleic acid sequence from the first-type DNA bricks. The first-type and the second-type DNA bricks may alternatively be assembled at the same time. In some embodiments, the first-type DNA brick and the second-type DNA brick may contain different numbers and/or arrangement of helices rendering different shaped and/or sized DNA bricks. In the example shown in FIG. 4(a), a first-type DNA brick (6 helices×4 helices) and a second-type DNA brick (6 helices×8 helices) constitute a feature-repeating unit of the nucleic acid template nanostructure, and arrows in FIG. 4(b) indicate extension directions of the feature-repeating units in the nucleic acid template nanostructure. Extending the feature-repeating units along the x-z direction yields the DNA template nanostructure with parallel trenches each of which is formed between two neighboring sidewalls. FIG. 4(c) illustrates a feature-repeating unit, where the light and the dark bundles represent a sidewall and a bottom layer of the feature-repeating unit.

In an example, the assembly of the DNA bricks into the nucleic acid template nanostructure follows a multi-stage isothermal reaction. For example, a 90 µL mixture of unpurified DNA bricks (IDTDNA Inc. or Sangon Biotech., pH 7.9, containing 300-600 nM of each brick, without careful adjustment of each brick stoichiometry), 5 mM trishydroxymethylaminomethane (Tris), 1 mM ethylene diamine tetraacetic acid (EDTA), and 40 mM $MgCl_2$ is incubated at 80° C. for 15 min, 44° C. for 12 h, 39° C. for 72 h, and 31° C. for 8 h sequentially to obtain a solution containing the nucleic acid template nanostructures. The as-synthesized nucleic acid template nanostructures can be used without further purification.

It should be appreciated by those skilled in the art that, in other embodiments, the nucleic acid template nanostructure may have a planar surface or other non-planar surfaces.

In Step 320, at least one nano-moiety is mixed with the template solution to assemble the at least one nano-moiety into at least one cavity region of the nucleic acid template nanostructures.

In some embodiments, the nano-moiety may include, without limitation, carbon nanotubes (CNTs), polymer-wrapped CNTs, CNT films, semiconductor nanoparticles, semiconductor nanowires, semiconductor nano-bricks, metal nanoparticles, metal nanowires, metal nano-bricks, polymeric nanoparticles, polymeric nanowires, polymeric nano-bricks, ceramic nanoparticles, ceramic nanowires, ceramic nano-bricks, metal oxide nanoparticles, metal oxide nanowires, metal oxide nano-bricks, fluoride nanoparticles, fluoride nanowires, fluoride nano-bricks, single-stranded or double-stranded nucleic acid (e.g., DNA, RNA, LNA, PNA). In some embodiments, the nano-moiety may also include, without limitation, plasmonic nanomaterials, fluorescent/luminescent nanomaterials, ferromagnetic nanomaterials, paramagnetic nanomaterials, antiferromagnetics nanomaterials, superparamagnetic nanomaterials, semiconductor nanomaterials, conductor nanomaterials or insulator nanomaterials.

In some embodiments, first-type nucleic acid handle(s) can be formed in the at least one cavity region of the nucleic acid template nanostructure; and second-type nucleic acid handle(s) interactable with the first-type nucleic acid handle(s) can be formed on the at least one nano-moiety, or vice versa. The nucleic acid handles can be formed and attached to the nucleic acid template nanostructure and the nano-moieties at desired locations depending on where the nano-moieties are to be assembled. The nano-moieties can be assembled on the nucleic acid template nanostructure by interactions between the first-type nucleic acid handle(s) and the second-type nucleic acid handle(s). In some embodiments, the first-type nucleic acid handle and the second-type nucleic acid handle are partially or wholly complementary single-stranded nucleic acid strands.

Figure 5:
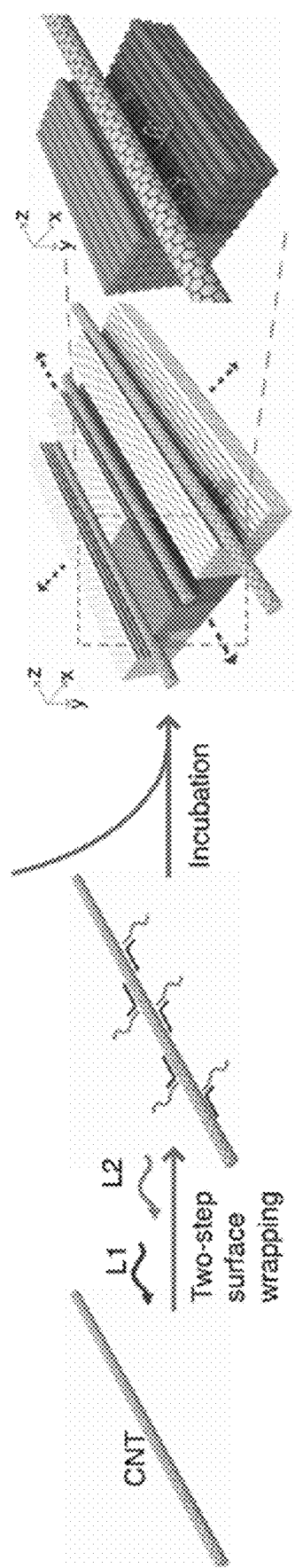
FIG. 5 illustrates a process for assembling at least one nano-moiety on a nucleic acid template nanostructure according to an embodiment of the present application.

In an example, four 14-nucleotide (nt) single-stranded DNA (ssDNA) handles are introduced in a cavity region of the nucleic acid template nanostructure by extending the 3' or 5' ends of four selected DNA bricks (see the arrows in FIG. 4(c)). Then, with reference to FIG. 5, DNA anti-handles (sequences complementary to the DNA handles introduced in the cavity region) are wrapped onto CNTs through non-covalent interactions to form anti-handles mediated CNT assembly. After that, at mild conditions, the hybridization between the DNA handles and the anti-handles mediated CNT assembly within the parallel nano-trenches of the nucleic acid template nanostructure at prescribed inter-CNT pitch.

Figure 6:
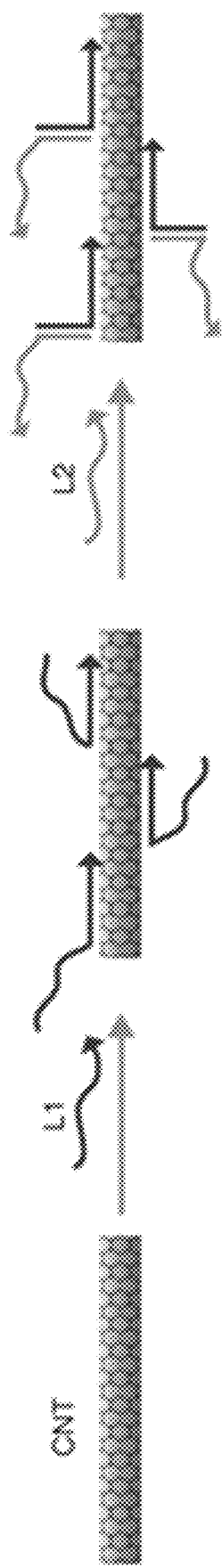
FIG. 6 illustrates a process for wrapping DNA anti-handles onto CNTs according to an embodiment of the present application.

FIG. 6 illustrates an exemplary process for wrapping DNA anti-handles onto CNTs (Z. Zhao, Y Liu, H. Yan, DNA origami templated self-assembly of discrete length single wall carbon nanotubes, Org. Biomol. Chem. 11, 596-598 (2013), incorporated by reference herein). First, a strand L1 (25 µM, sequence: 5'-GATGCGAGGCTAT-TCTGTGTGTGTGTGTGTGTGTGTGTGTGTGTGTGT GTGTGTGT-3') was mixed with single-walled CNT powder (0.1 mg) in buffer (1×Tris-borate EDTA (TBE) and 100 mM NaCl at pH 8.3). The mixture was sonicated for 1 h, followed by high-speed centrifuge at 16,000 g for 30 min to remove aggregates. The supernatant solution was then purified using 100 kD Amicon filter (provided by EMD Millipore) to get rid of excessive DNAs. A strand L2 (10 µM, sequence: 5'-AGAATAGCCTCGCATCCCACTTAC-CACTTA-3') was added to the purified CNT-L1 sample and annealed from 37° C. to 23° C. within 2 h, followed by incubation at 23° C. for 16 h. L2-wrapped CNTs were used without further purification.

Then, in an example, L2-wrapped CNTs (0.4 µL) were mixed with 0.4 µL diluted nucleic acid template nanostructures (10× dilution into 15 mM $MgCl_2$ solution) into 6 L final solution containing 10 mM $MgCl_2$ and 400 mM NaCl (for 24-nm inter-CNT pitch sample) or 10 mM $MgCl_2$, 300 mM NaCl, and 300 mM LiCl (for 16-/12-/10-nm inter-CNT pitch sample) or 15 mM $MgCl_2$ and 600 mM NaCl (for 16-nm inter-CNT pitch fixed-width sample). The reaction buffer was incubated at 33° C. for 9 h, and then stored at 4° C. without further purification.

In some embodiments, for the assembly of DNA brick crystals and DNA-wrapped CNTs, the buffer solutions were used according to previous reports (Y Ke et al., DNA brick crystals with prescribed depths, Nature Chem. 6, 994-1002 (2014); Z. Zhao, Y Liu, H. Yan, DNA origami templated self-assembly of discrete length single wall carbon nanotubes, Org. Biomol. Chem. 11, 596-598 (2013), incorporated by reference herein).

In Step 330, the nucleic acid template nanostructures are etched at their non-cavity regions.

In some embodiments, the nucleic acid template nanostructure is etched at the non-cavity region by carving nucleic acid strands which are fully complementary to nucleic acid strands at the non-cavity region (B. Wei et al., Complex Reconfiguration of DNA Nanostructures, Angew. Chem. Int. Ed. 2014, 53, 7475-7479, (2014), incorporated by reference herein). The etching mechanism is based on the hybridization of complement DNA sequences. When specific nucleic acid strands for etching strands of the non-cavity region of the nucleic acid template nanostructure are introduced, they could only etch away their fully complement partners in the nucleic acid template nanostructure (i.e., the strands at the non-cavity region). In this etching method, the removal of one nucleic acid strand at the non-cavity region reveals a newly exposed toehold on a neighboring strand, thus enabling removal of connected nucleic acid strands without the need to modify the strands with predesigned external toeholds. By using this method, the nucleic acid template nanostructure can be reconfigured into a prescribed shape, and the etched thickness can be precisely controlled.

Figure 7:
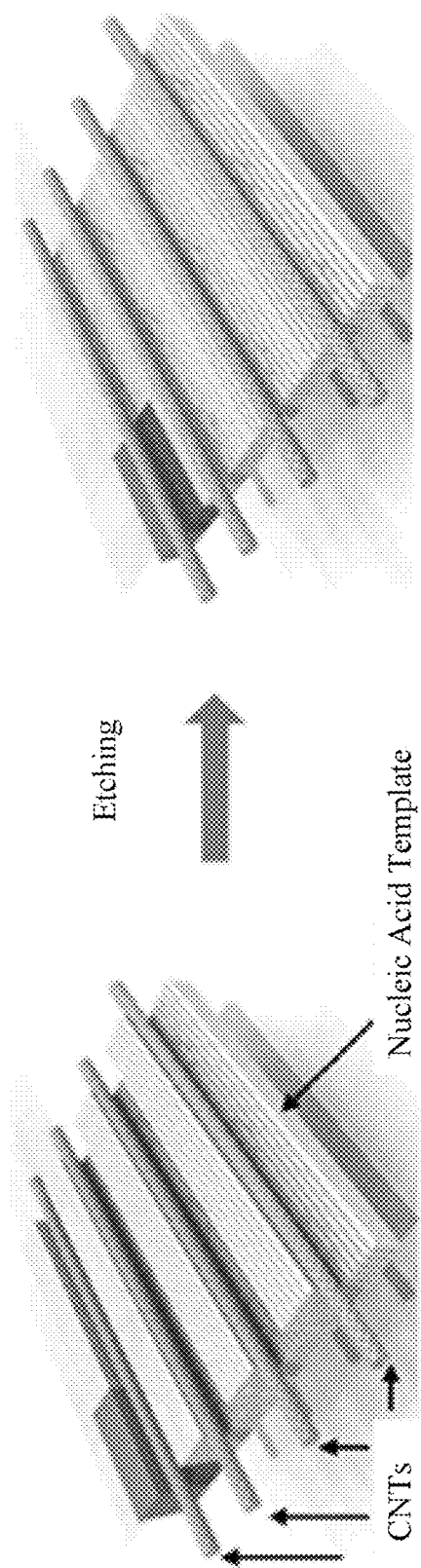
FIG. 7 illustrates a process for selectively etching a nucleic acid template nanostructure at a non-cavity region thereof according to an embodiment of the present application.

FIG. 7 illustrates an exemplary process for etching a nucleic acid template nanostructure at the non-cavity region. In this example, after etching, a top surface of the nucleic acid template nanostructure is substantially evened. In other embodiments, the top surface of the non-cavity region may be higher or lower than that of the cavity region.

It can be appreciated that, in some embodiments, Step 330 can be omitted and thus the shape of the nucleic acid template nanostructure may not be reconfigured.

Flattening the top surface of the nucleic acid template nanostructure helps to remove salt residues on the template nanostructure, especially in the cavity regions. The salt residues may arise from the remaining solution within the nucleic acid template nanostructure because of a capillary force phenomenon. That is, metal salts in the remaining solution may be left within the cavity region after water evaporation. Etching the nucleic acid template nanostructure will lower the capillary force and the remaining solution, and thus reduce the salt residues left on the nucleic acid template nanostructure and CNTs.

In Step 340, the nucleic acid template nanostructures are deposited onto the substrate by contacting the template solution with the substrate.

In some embodiments, the substrate may be the same as that in Step 120 of the method 100 described above.

In some embodiments, depositing nucleic acid template nanostructures onto the substrate may include: forming a patterned alignment layer having a plurality of cavities on the substrate; dipping the template solution containing the template nanostructures onto the patterned alignment layer; and incubating the substrate to diffuse the template nanostructures into the cavities. In some embodiments, incubating the substrate may include dehydrating or evaporating the substrate in a sealed chamber for a predetermined time period. In some embodiments, each cavity may be filled with one nucleic acid template nanostructure, and in some other embodiments, each cavity may be filled with one or more nucleic acid template nanostructures.

Figure 8:
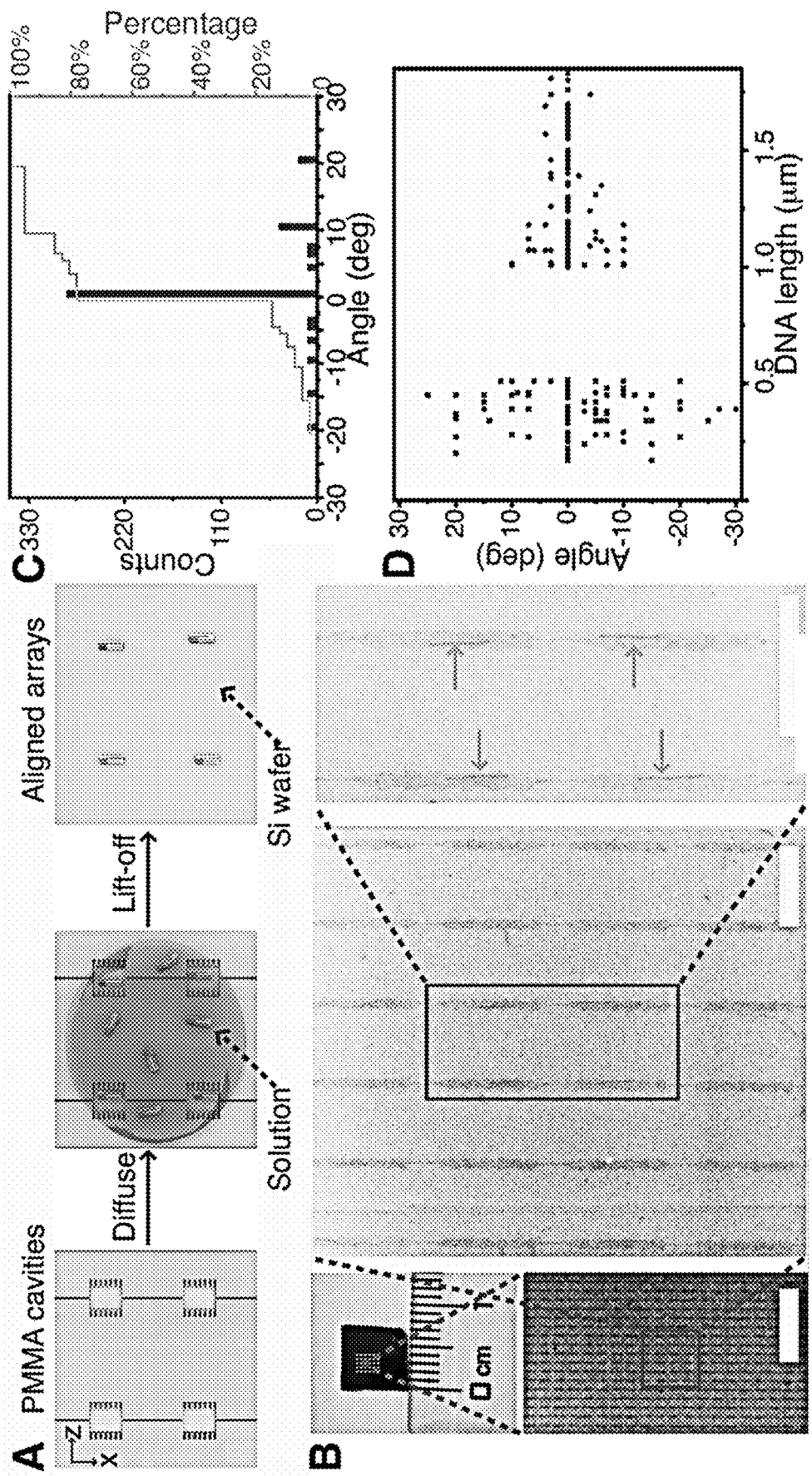
FIG. 8 (A) illustrates a process for depositing a nucleic acid template nanostructure onto a substrate according to an embodiment of the present application.

FIG. 8 (A) illustrates an exemplary process for depositing the nucleic acid templates onto the substrate. First, a 0.35 $cm^2$ sized silicon substrate was spin-coated with poly(m-ethyl methacrylate) (PMMA) resist (Allresist AR-P 672.045) and patterned using electron-beam lithography (Raith Voyager, with an exposure dose of 325 μC/$cm^2$ at 0.9 nA current). In this example, more than $5 \times 10^4$ PMMA cavities (surface density~$2 \times 10^7$ cavities/$cm^2$) were fabricated. Each PMMA cavity exhibited 2.5 μm in length along x direction, and 150 nm in thickness along y direction which is perpendicular to the x-z plane. The minimum and the maximum values of the cavity widths along z direction were 180 and 250 nm, respectively. The patterned PMMA layer was developed in a 1:3 mixture of methylisobutyl ketone (MIBK) and isopropyl alcohol (IPA), followed by rinsing with IPA and drying with nitrogen. The solution of CNT-decorated DNA template nanostructures was dipped onto the lithography-defined patterns. Then the silicon substrate was kept in a sealed chamber for 2 hours. During this process, the DNA template nanostructures were diffused into the PMMA cavities. Si substrate was then dried, followed by PMMA liftoff, leaving only the aligned DNA template nanostructures on the flat Si substrate. After DNA deposition and PMMA liftoff, more than 85% of the initial cavities (~600 cavities were counted) were occupied by the DNA template nanostructures. The measured angular distribution, which was defined as the difference between the longitudinal axis of DNA template nanostructures and the x direction of the substrate, was 56% within ±1° and 90% within ±7°, per SEM-based counting of all the remaining DNA template nanostructures within the 600 cavities. The measured angular distribution combined the impacts from the fabrication defects of PMMA cavities, the variation during DNA placement, and the disturbance during PMMA liftoff. Notably, the angular distribution improved when compared to previous report in large-scale placement of DNA-templated inorganic materials (A. M. Hung et al., Large-area spatially ordered arrays of gold nanoparticles directed by lithographically confined DNA origami, *Nature Nanotech.* 5, 121-126 (2010).).

Both the lengths of the DNA template nanostructures and the aspect ratio of the PMMA cavities may affect the angular distribution. Longer DNA template nanostructures (length>1 μm) exhibited narrower angular distribution (0°±3.4°) than that of shorter DNA template nanostructures (length<500 nm, 1°±11°). In addition, PMMA cavities with higher length-to-width aspect ratio (e.g. 10 or higher) provided better orientation controllability than that with lower aspect ratio (i.e. 1 to 3 or lower). Hence, to further improve the angular distribution, longer DNA template nanostructures, as well as higher length-to-width aspect ratio of PMMA cavities, are beneficial.

In some embodiments, the nucleic acid templates can be deposited on the substrate directly, without forming the patterned alignment layer with the plurality of cavities on the substrate. In an example, a 230-nm thick PMMA layer was spun onto Si wafer (with 300-nm thick $SiO_2$ on top) and the fine alignment marker pattern was written using Raith Voyager system (at a current of 9 nA and a dose of 780 μC/cm2). The alignment marker pattern was developed in a 1:3 mixture of MIBK and IPA. A stacking titanium/gold film (5-nm thick titanium and 45-nm thick gold) was deposited using DE400 e-beam evaporation system. Liftoff was performed at room temperature in acetone without sonication, followed by an ethanol rinsing. The sample was dried with nitrogen. Then, a 9 μL solution of the assembled CNT-decorated DNA template nanostructures (i.e., the DNA template nanostructures with the CNTs in the cavity regions) was dipped onto the oxygen plasma-cleaned marked Si wafer, followed by the incubation at room temperature for 1 hour. After that, the remaining solution was blown away with nitrogen. The Si wafer was sequentially rinsed with 75%, 95%, and 99% ethanol, followed by air drying. The positions of the CNT-decorated DNA template nanostructures were registered relative to the alignment markers.

More details about the process of depositing the nucleic acid template nanostructures onto the substrate can be found in the PCT application No. PCT/CN2020/082377 filed on Mar. 31, 2020 and entitled "method for depositing template nanostructures on a substrate and nanostructure arrays", and in the PCT application No. PCT/CN2020/082777 filed on Apr. 1, 2020 and entitled "method for depositing template nanostructures on a substrate and nanostructure arrays", the entire contents of which are incorporated by reference herein.

In Step 350, at least one fixation structure is formed on the substrate. The at least one fixation structure intersects with all or a portion of the at least one nucleic acid template nanostructure to fix all or the portion of the at least one nucleic acid template nanostructures on the substrate.

Some details about the process of forming the at least one fixation structure onto the substrate can be found in Step 130 of the method 100 as described above, and thus are not elaborated herein.

In an example, a 230-nm thick PMMA layer was spun onto the CNT-deposited Si wafer. The fixation structure pattern was written using Raith Voyager system (at a current of 400 pA and a dose of 750 μC/cm2). The fixation structure pattern was developed in a 1:3 mixture of MIBK and IPA.

A stacking film of 5-nm thick titanium and 60-nm thick gold was deposited using DE400 e-beam evaporation system. Liftoff was performed at room temperature in acetone without sonication, followed by an ethanol rinse. Then, the sample was dried with nitrogen.

Figure 9:
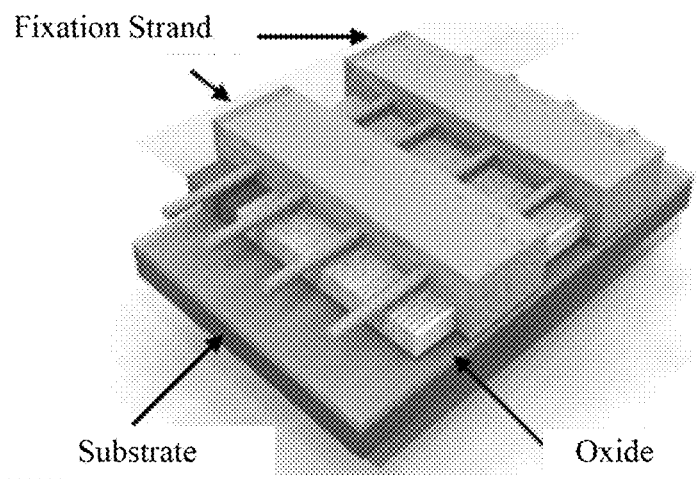
FIG. 9 illustrates an exemplary nucleic acid template nanostructure on a substrate after a fixation strand is formed on the substrate.

FIG. 9 illustrates an example of the nucleic acid template nanostructure after forming the fixation structure on the substrate. In this example, two fixation structures are formed on the nucleic acid template nanostructure, and both ends of each CNT were fixed by two fixation structures. As such, the fixation structures provide anchors on the substrate for the nano-moiety. In some other embodiments, three or more fixation structures may be formed on the nucleic acid template nanostructure, depending on, for example, the length, size or shape of the nano-moieties. In some embodiments, the fixation structures can be formed spaced apart from each other, leaving sections of the nano-moieties uncovered with the fixation structures for subsequent formation of other structures or components. In some embodiments, the fixation structures may be of an elongated shape perpendicular to a lengthwise direction of the nano-moiety, like the fixation structures shown in FIG. 9. In some other embodiments, the fixation structures may be of any other shapes (e.g. circular, loop, etc.) that fit for fixing the nano-moiety on the substrate.

In Step 360, at least a portion of the nucleic acid template nanostructure is removed.

In some embodiments, the removed portion of the nucleic acid template nanostructure is not covered with the at least one fixation structure before the removal step. In some other embodiments, all the nucleic acid template nanostructures are removed.

Figure 10:
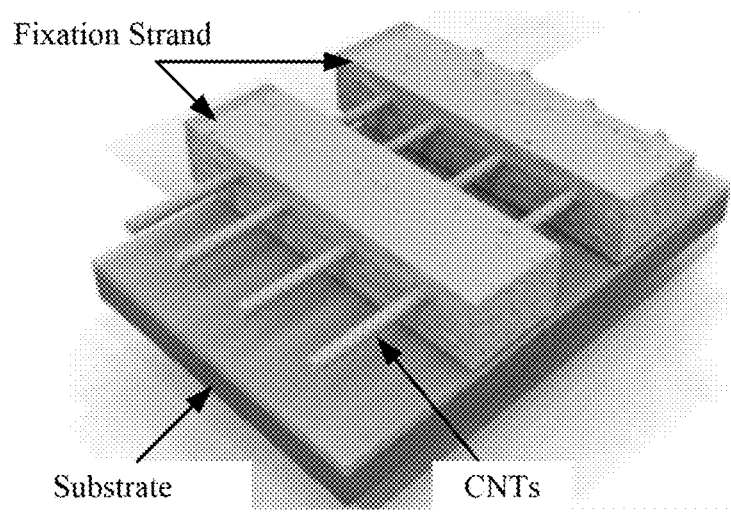
FIG. 10 illustrates an exemplary substrate after a nucleic acid template nanostructure is removed therefrom.

In some embodiments, the at least a portion of the nucleic acid template nanostructure is removed by a rinsing process, a thermal annealing process or a chemical oxidation process. For example, the substrate is continuously rinsed with water and $H_2O_2$ (5%) to remove the nucleic acid template nanostructure. FIG. 10 illustrates an example of the substrate after removing the nucleic acid template nanostructure. In this example, the nucleic acid template nanostructure is substantially removed from the surface of the substrate. Generally, removing the nucleic acid template nanostructure may further reduce the salt residues left on the substrate and the CNTs.

By using the method 300 as described above, nano moiety arrays such as CNT array can be formed on a substrate with desired arrangement, and contaminations can be eliminated without degrading CNT alignment. Thus, high-performance ultra-scaled devices such as FET devices can be built based on these nano-moiety arrays.

Figure 11:
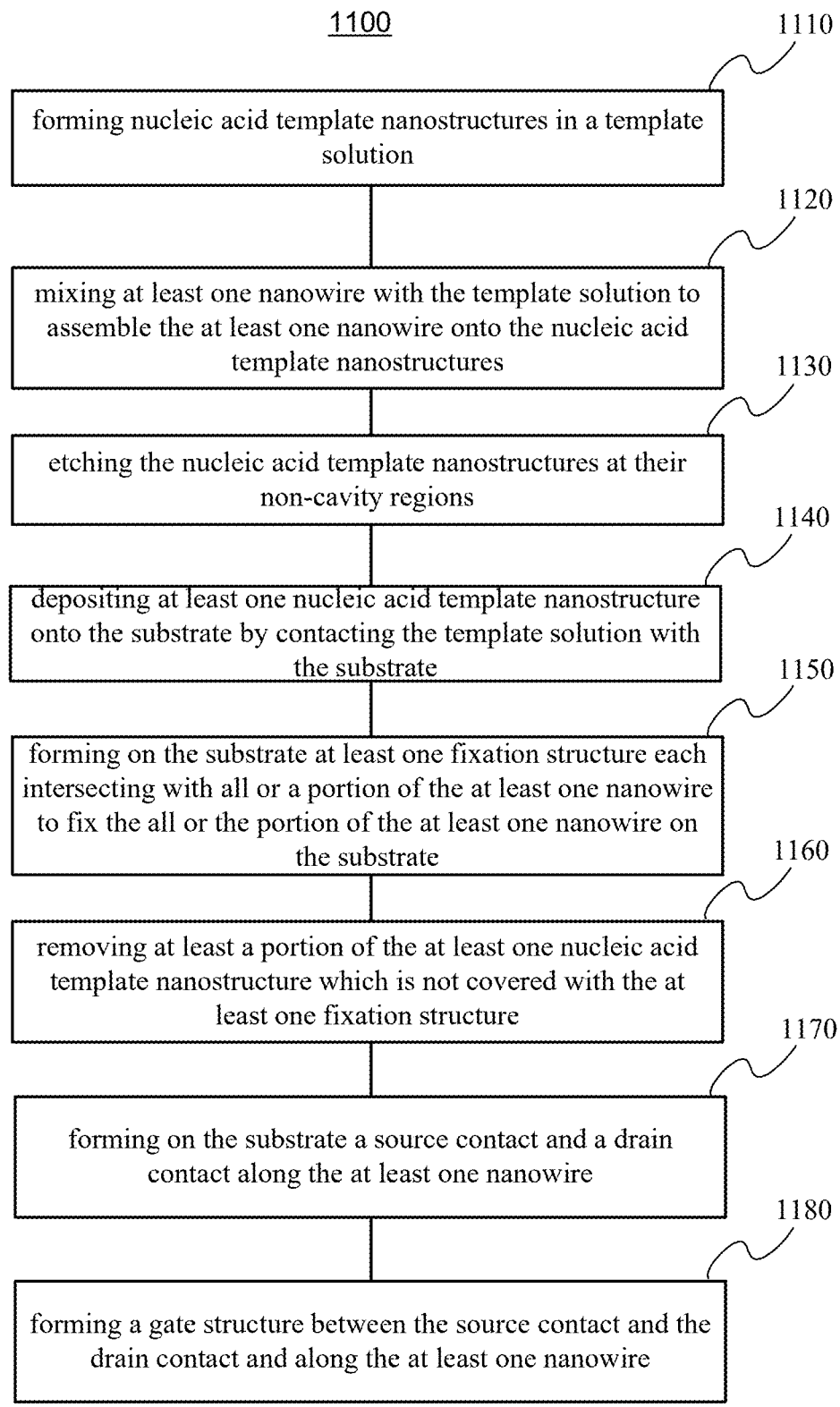
FIG. 11 illustrates a flow chart of a method for forming a FET device according to an embodiment of the present application.

FIG. 11 illustrates a flow chart of a method 1100 for forming a FET device according to an embodiment of the present application. The method 1100 may include the following steps 1110-1180.

In Step 1110, nucleic acid template nanostructures are formed in template solution.

In some embodiments, each nucleic acid template nanostructure may include at least one cavity region and a non-cavity region outside of the at least one cavity region. It should be appreciated by those skilled in the art that, in other embodiments, the nucleic acid template nanostructure may have a planar surface or other non-planar surfaces.

In Step 1120, at least one nanowire is mixed with the template solution to assemble the at least one nanowire onto the nucleic acid template nanostructures.

In some embodiments, when the nucleic acid template nanostructure includes at least one cavity region and a non-cavity region outside of the at least one cavity region, the at least one nanowire is assembled into at least one cavity region of the nucleic acid template nanostructures.

In other embodiments, when the nucleic acid template nanostructure has a planar surface, the at least one nanowire is assembled onto a portion of the planar surface where the nucleic acid handles are formed.

It can be appreciated that the template solution containing nucleic acid template nanostructures with decorated nanowire(s) or any other template nanostructures can be prepared in advance.

In Step 1130, the nucleic acid template nanostructure is etched at the non-cavity region.

In Step 1140, at least one nucleic acid template nanostructure is deposited onto the substrate by contacting the template solution with the substrate.

In Step 1150, at least one fixation structure is formed on the substrate, wherein the at least one fixation structure intersects with all or a portion of the at least one nanowire to fix all or a portion of the at least one nanowire on the substrate.

In Step 1160, at least a portion of the at least one nucleic acid template nanostructure which is not covered with the fixation structures is removed.

The above steps 1110-1160 of the method 1100 are similar to the steps 310-360 of the method 300, and thus are not elaborated herein.

In Step 1170, a source contact and a drain contact are formed on the substrate along the at least one nanowire.

In some embodiments, the source and drain contacts may include any suitable contact metal including, but not limited to, gold (Au), titanium (Ti), palladium (Pd), scandium (Sc), etc. using a standard deposition process such as evaporation, sputtering, etc.

Figure 12:
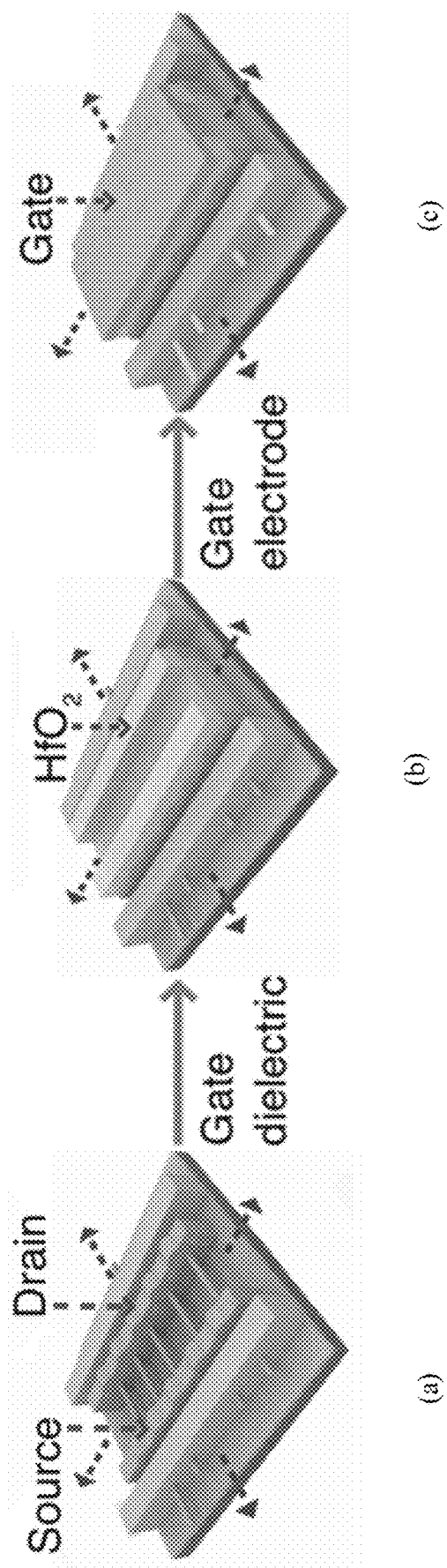
FIGS. 12(a), 12(b) and 12(c) illustrate a process for forming a gate structure of a FET device according to an embodiment of the present application.

FIG. 12(*a*) illustrates an example of the device after forming the source contact and the drain contact. In this example, two fixation structures are formed on the CNTs, and the source contact and the drain contact are formed between the two neighboring fixation structures. As can be seen, the CNTs can be fixed by the two fixation structures with sections between the fixation structures intersecting with the source and drain contacts, while the ends of certain CNTs protruding outside the fixation structures may not be used for FET construction.

The source and drain contacts can be formed using conventional metal or poly formation methods. In an example, a 230-nm thick PMMA layer was spun onto the CNT arrays, followed by writing the source and the drain electrodes patterns with Raith Voyager system (at a current of 400 pA and a dose of 750 µC/cm$^2$). The source and the drain electrode patterns were developed in a 1:3 mixture of MIBK and IPA. A stacking film of 0.5-nm thick titanium, 30-nm thick palladium, and 40-nm thick gold was deposited using DE400 e-beam evaporation system. Liftoff was performed at room temperature in acetone without sonication, followed by an ethanol rinsing. Then, the sample was dried with nitrogen.

In Step 1180, a gate structure between the source contact and the drain contact and along the at least one nanowire is formed.

In some embodiments, the gate structure including a gate dielectric and a gate contact. The gate dielectric may include any suitable dielectric including, but not limited to, $SiO_2$, $Al_2O_3$, $HfO_2$, $Si_3N_4$, $Y_2O_3$, etc. formed using a standard deposition process such as evaporation, sputtering, etc.

FIGS. 12(*b*) and 12(*c*) illustrate an example of the device after forming the gate structure. In this example, an alignment layer of 230-nm thick PMMA was spun onto the Si wafer, followed by writing the channel patterns with Raith Voyager system (at a current of 400 pA and a dose of 750 μC/cm²). 1 nm thick yttrium metal film was first deposited using DE400 e-beam evaporation system. Liftoff was performed at 70° C. in acetone. Then, the yttrium film was oxidized in the air at 250° C. A 230-nm thick PMMA layer was then spun onto the $Y_2O_3$-coated Si wafer, followed by writing the gate electrode pattern with Raith Voyager system (at a current of 400 pA and a dose of 750 μC/cm²). The gate electrode pattern was developed in a 1:3 mixture of MIBK and IPA. 8-nm thick $HfO_2$ was next deposited via atomic layer deposition (Beneq) at 90° C. to form the gate dielectric. A 15-nm thick palladium film was finally deposited using DE400 e-beam evaporation system. Liftoff was performed at room temperature in acetone without sonication, followed by ethanol rinsing. Then, the sample was dried with nitrogen. As such the gate contact can be formed.

In some embodiments, contact pads connected to the source contact, the drain contact and the gate structure are further formed. These contact pads may be used for electrical measurements of the constructed CNT FET.

In an example, a 230-nm thick PMMA layer was first spun onto the sample. Contact pad pattern was exposed using Raith Voyager system (at a current of 9 nA and a dose of 750 μC/cm²). The contact pad pattern was developed in a 1:3 mixture of MIBK and IPA, then dried with nitrogen. A stacking film of 5-nm thick titanium and 70-nm thick gold was deposited using DE400 e-beam evaporation system. Liftoff was performed at room temperature in acetone without sonication, followed by ethanol rinsing. Then, the sample was dried with nitrogen.

In some embodiments, after the gate structure is formed, the fixation structure can be removed from the surface of the substrate.

In some embodiments, a single CNT has one source contact, one drain contact and one gate structure to form a single-channel CNT FET. An example of the single-channel CNT FET is illustrated in FIGS. 13(a) and 13(b), in which FIG. 13(a) is a side view of the single-channel CNT FET, and FIG. 13(b) is a top view of the single-channel CNT FET.

In some embodiments, two, three, four or more CNTs having a common source contact, a common drain contact and a common gate structure can be used to form a multi-channel CNT FET. An example of the multi-channel CNT FET is illustrated in FIGS. 14(a) and 14(b), in which FIG. 14(a) is a side view of the multi-channel CNT FET, and FIG. 14(b) is a top view of the multi-channel CNT FET.

Figure 15:
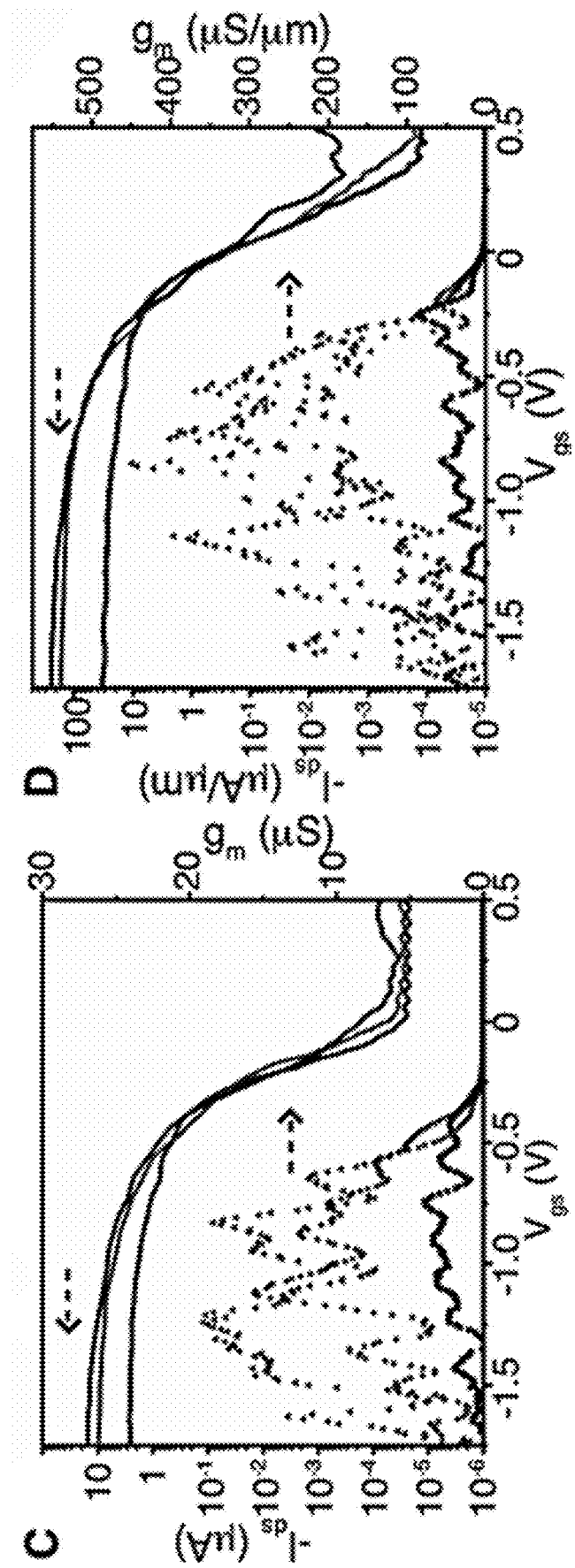
FIGS. 15(a) and 15(b) illustrate $I_{ds}$-$V_{gs}$ curves and $g_m$-$V_{gs}$ curves for a single-channel CNT FET and a multi-channel CNT FET, respectively.

Certain electrical measurements were performed on samples of the CNT FETs formed using the above processes at room temperature in a probe station connected to a Keithley 4200 SCS Semiconductor Device Analyzer. FIGS. 15(a) and 15(b) illustrate $I_{ds}$-$V_{gs}$ curves and $g_m$-$V_{gs}$ curve for a single-channel CNT FET and a multi-channel CNT FET, respectively. As shown in FIG. 15(a), the single-channel CNT FET (channel length of 200 nm) exhibited on-current of 10 μA/CNT ($V_{ds}$ of −0.5 V) at the thermionic limit of subthreshold swing (i.e. 60 mV/dec). As shown in FIG. 15(b), at $V_{ds}$ of −0.5 V, the multi-channel CNT FET (channel length of 200 nm, inter-CNT pitch of 24 nm) exhibited $V_{th}$ of −0.26 V, $I_{on}/I_{off}$ of $10^6$, on-current density of 154 μA/μm (at $V_{gs}$ of −1.5 V), and subthreshold swing of 100 mV/dec. The $g_m$ and $G_{on}$ values were 0.37 mS/μm and 0.31 mS/μm, respectively.

Example

This is an example for constructing high-performance transistors that the methods according to embodiments of the present application can be used.

In projected high-performance energy-efficient field-effect transistors (FETs) (Reference 1, Reference 2), evenly-spaced small-pitch (spacing between two adjacent channels within individual FET) semi-conductor channels are often required. Smaller channel pitch leads to higher integration density and on-state performance, but with the risk of enhanced destructive short-range screening and electrostatic interactions in low-dimensional semiconductors, such as carbon nanotubes (CNTs) (Reference 3); whereas evenly-spaced alignment minimizes the channel disorder that impacts the switching between on/off states (Reference 4). Therefore, although high-density CNT thin-films exhibit on-state performance comparable with Si FETs (Reference 5, Reference 6), degraded gate modulation and increased subthreshold swing (Reference 3, Reference 5) are observed because of the disorder in the arrays.

Biomolecules such as DNAs (Reference 7, Reference 8) can be used to organize CNTs into prescribed arrays (Reference 9-Reference 11). Based on the spatially hindered integration of nanotube electronics (SHINE), biofabrication further scales the evenly-spaced channel pitch beyond lithographic feasibility (Reference 12). However, none of the biotemplated CNT FETs (Reference 12-Reference 14) have exhibited performance comparable with those constructed from lithography (Reference 15) or thin-film approaches (Reference 3, Reference 5, Reference 6, Reference 16-Reference 18). Meanwhile, during the surface placement of biotemplated materials, broad orientation distributions (Reference 19) prevent their large-scale alignment.

Here, we show that small regions of nanometer-precise biomolecular assemblies can be integrated into the large arrays of solid-state high-performance electronics. We used the parallel semiconducting CNT arrays assembled through SHINE as model systems (Reference 12). At the FET channel interface, we observed lower on-state performance induced by high-concentration DNA/metal ions. Using a rinsing-after-fixing approach, we eliminated the contamination without degrading CNT alignment. Based on the uniform inter-CNT pitch and clean channel interface, we constructed solid-state multichannel PMOS (p-channel metal-oxide-semiconductor) CNT FETs displaying high on-state performance and fast on/off switching simultaneously. Using lithography-defined polymethyl methacrylate (PMMA) cavities to spatially confine the placement of the CNT-decorated DNA templates, we demonstrated aligned arrays with prescribed geometries over a 0.35-cm² area substrate. Building high-performance ultra-scaled devices at the biology-electronics interface may enable diverse applications in the post-Si era, such as multiplexed biomolecular sensors (Reference 20) and 3D FETs, with nanometer-to-centimeter array scalability.

Figure 20:
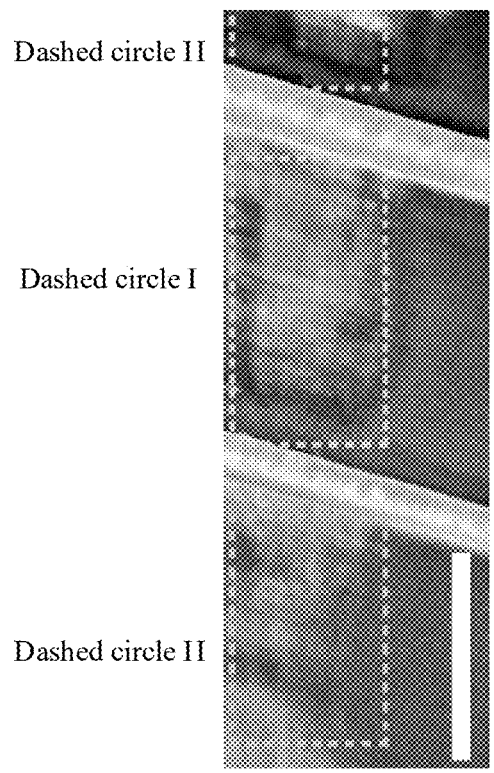
FIG. 20 shows SEM image of fixed CNT array after DNA removal. In the dashed circle I area, both ends of CNTs were fixed by two metal bars, and used for FET construction. In the dashed circle II areas, the unfixed CNT ends may be disturbed during DNA removal, and were not used for FET construction. The scale bar is 500 nm.
Figure 21:
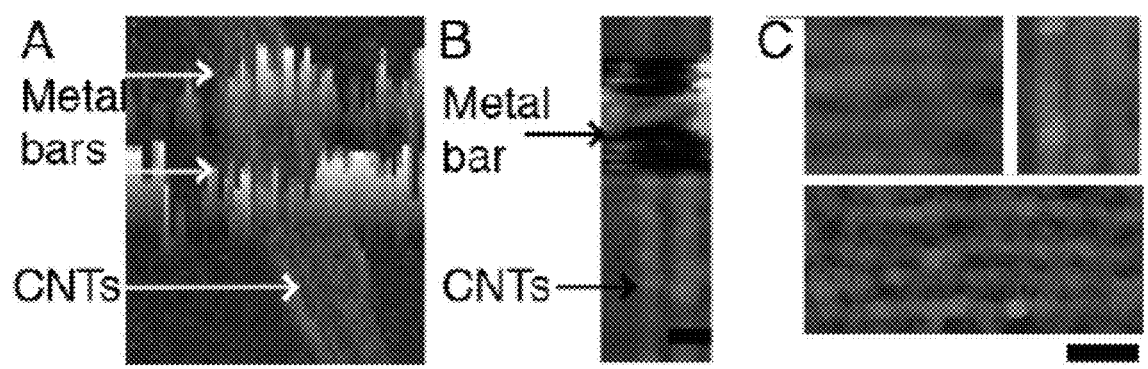
FIG. 21 shows AFM images of the fixed CNT arrays after DNA removal. (A) 3D zoomed-out view of the CNT arrays fixed by two metal bars. (B) zoomed-in view of CNTs fixed by metal bar. The scale bar is 25 nm. (C) more zoomed-in AFM images of the fixed CNT arrays after DNA removal. The scale bar is 50 nm.
Figure 22:
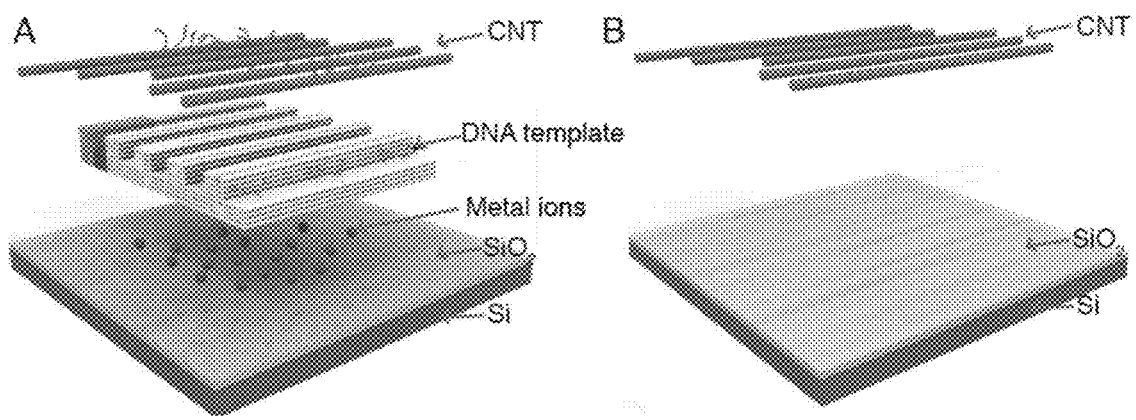
FIG. 22 shows schematics for different compositions at channel interface. (A) after assembly and (B) after removing DNA templates and metal ions.

We assembled DNA-templated CNT arrays using DNA-based SHINE (Reference 12). We applied a rinsing-after-fixing approach (FIG. 16A) to remove DNA templates. Starting from the surface-deposited DNA-templated CNT arrays, both ends of the DNA-templated CNT arrays were first fixed onto Si wafer with deposited metal bars (first step in FIG. 16A). DNA templates and high-concentration metal salts (1 to 2 M) within DNA helices were gently removed through sequential rinsing with water and low-concentration $H_2O_2$ (second step in FIG. 16A and FIG. 22). The inter-CNT pitch and the alignment quality of the assembled CNTs were not degraded during the rinsing (FIG. 16B, FIGS. 20 and 21).

Figure 16:
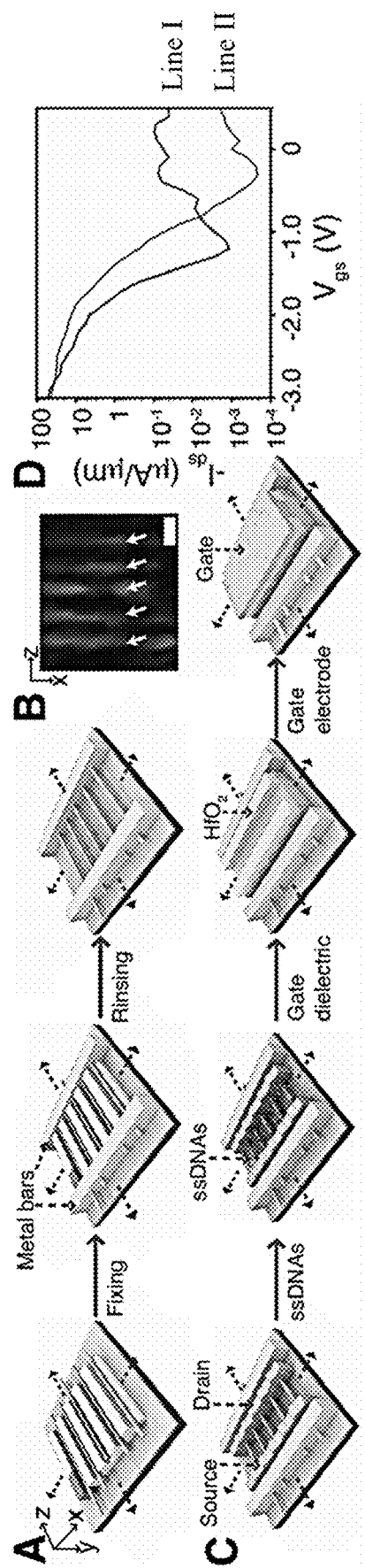
FIG. 16 shows multichannel CNT FETs with ssDNAs at channel interface. (A) Design schematic for the rinsing-after-fixing approach. (B) Zoomed-in AFM image along the x and z projection direction for CNT arrays after template removal. The scale bar is 25 nm. See also FIGS. 20 and 21. (C) Design schematic for introducing ssDNAs at channel interface and FET fabrication. (D) The $I_{ds}$-$V_{gs}$ curves (plotted in logarithmic at $V_{ds}$ of −0.5 V) for multichannel DNA-containing CNT FET before (Line I) and after (Line II) thermal annealing. See also FIG. 24.
Figure 23:
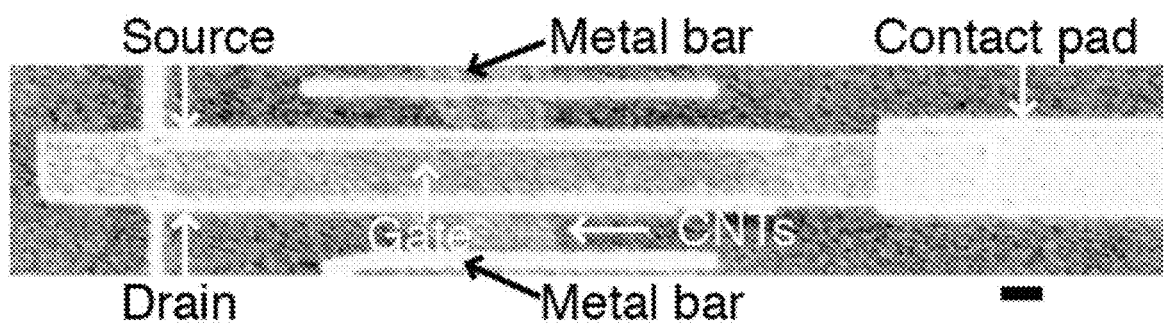
FIG. 23 shows Zoomed-out SEM image of the constructed multichannel DNA-containing CNT FET. The scale bar is 200 nm.

To explore the impact of single-stranded DNAs (ssDNAs) at channel interface, we first fabricated the source and drain electrodes onto the rinsed CNT arrays (FIG. 16C, left). Next, ssDNAs were introduced exclusively into the predefined channel area (first step in FIG. 16C, channel length of 200 nm). Finally, gate dielectric of HfO₂ and gate electrode of Pd were sequentially fabricated (second and third steps in FIG. 16C and FIG. 23).

Figure 24:
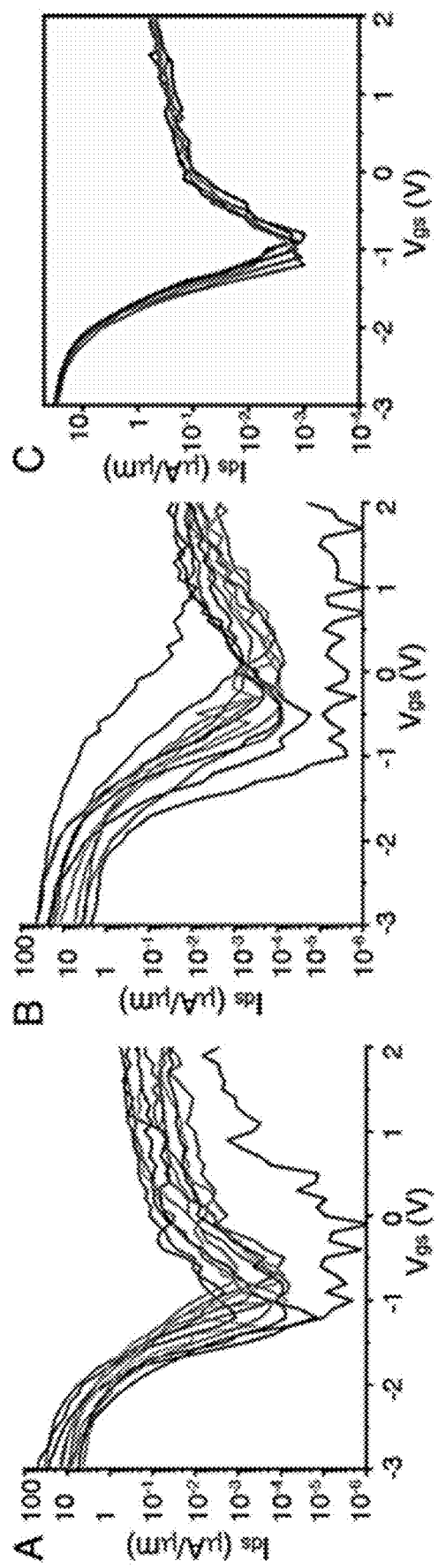
FIG. 24 shows the $I_{ds}$-$V_{gs}$ curves for multichannel DNA-containing CNT FETs. The CNT FETs before (A) and after (B) thermal annealing. Different lines represent distinct CNT FETs. (C) one DNA-containing CNT FET in (A) under repeated measurements from 2V to −3V. Different lines represent distinct measurements. The $V_{ds}$ in (A), (B), and (C) were all set at −0.5 V. Ids was normalized to the inter-CNT pitch.

Out of 19 FETs we constructed, 63% (12 out of 19) showed typical gate modulation ($I_{on}/I_{off}$ exceeded $10^3$, FIG. 24). The other 7 devices exhibited $I_{on}/I_{off}$<5, which was caused by the presence of metallic CNTs within the array. At a source-to-drain bias ($V_{ds}$) of −0.5 V, one typical multi-channel DNA-containing CNT FET (FIG. 16D) exhibited threshold voltage ($V_{th}$) around −2 V, on-current density of 50 μA/μm at gate-to-source bias ($V_{gs}$) of −3 V (normalized to inter-CNT pitch), subthreshold swing of 146 mV/decade, peak transconductance ($g_m$) of 23 μS/μm, and on-state conductance ($G_{on}$) of 0.10 mS/μm. Statistics over all the 12 operational FETs exhibited $V_{th}$ distribution of −2±0.10 V, on-current density of 4-50 μA/μm, and subthreshold swing of 164±44 mV/decade (FIG. 24A). The transport performance was stable during repeated measurements (FIG. 24C).

Figure 31:
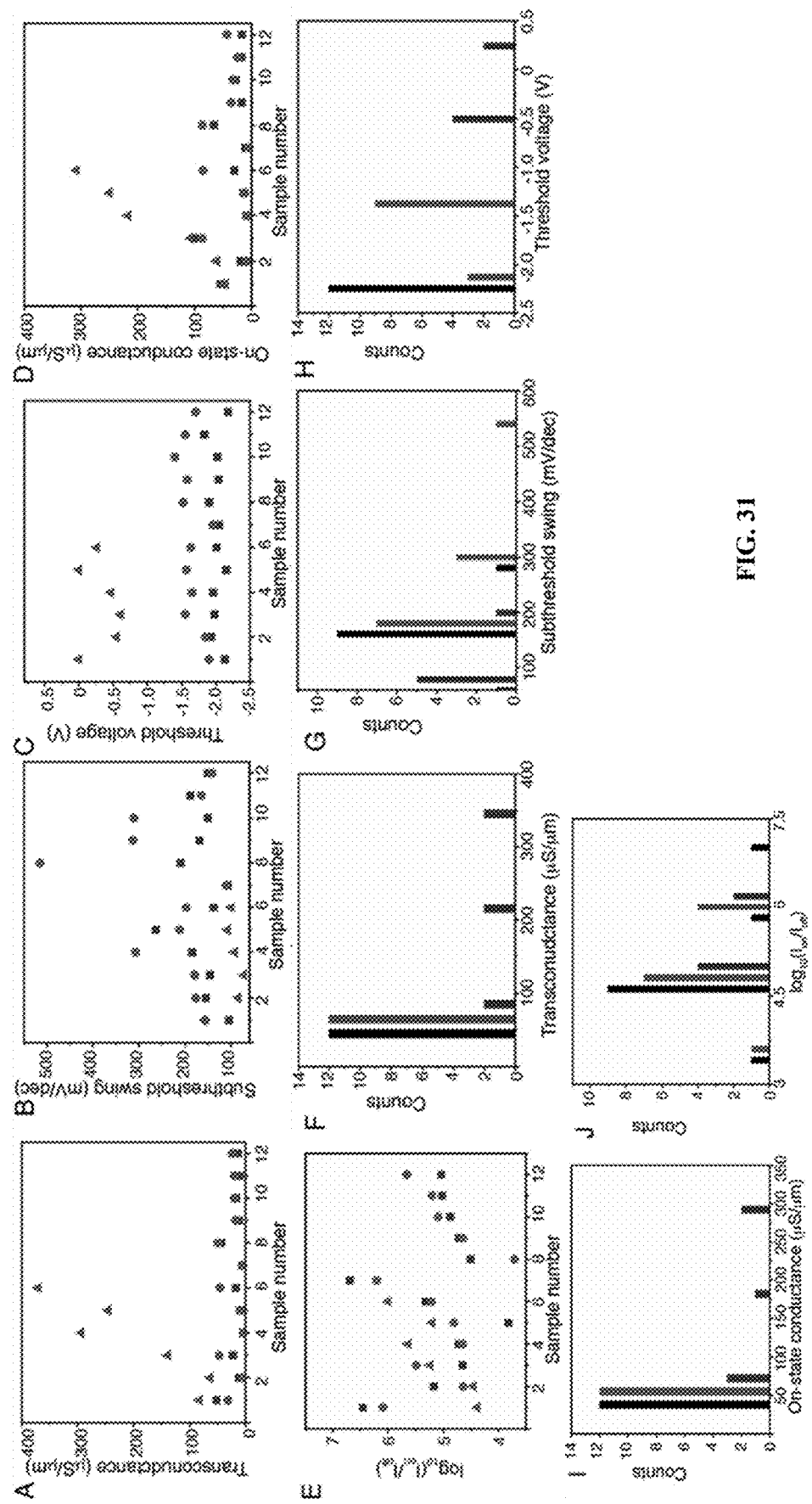
FIG. 31 shows performance comparisons for the constructed multichannel CNT FETs with different interfacial compositions. From (A) to (E), transconductance, subthreshold swing, threshold voltage, on-state conductance, and $I_{on}/I_{off}$ are compared for different FET samples. Squares represent multichannel DNA-containing CNT FETs before annealing. Circles represent thermal-annealed multichannel DNA-containing CNT FETs. Triangles represent multichannel DNA-free CNT FETs. Sample number was the assigned testing number for each FET. From (F) to (J), statistics of transconductance, subthreshold swing, threshold voltage, on-state conductance, and $I_{on}/I_{off}$ for different channel compositions. Bars I represent multichannel DNA-containing CNT FETs before annealing. Bars II represent thermal-annealed multichannel DNA-containing CNT FETs. Bars III represent multichannel DNA-free CNT FETs. All the performance data were acquired at the $V_{ds}$ of −0.5 V. For multichannel DNA-containing CNT FETs before and after annealing, the performance data were acquired at the $V_{gs}$ of −3.0 V. For multichannel DNA-free CNT FETs, the performance data were acquired at the $V_{gs}$ of −1.5 V.

We annealed the above DNA-containing FETs at 400° C. for 30 min under vacuum to thermally decompose ssDNAs (Reference 22), and then recharacterized the transport performance. Compared to the unannealed samples, thermal annealing (FIG. 16D, FIGS. 23 and 31) slightly shifted the average $V_{th}$ (around 0.35 V, $V_{th}$ of −1.65±0.17 V after annealing), and increased the average subthreshold swing by ~70 mV/decade (subthreshold swing of 230±112 mV/decade after annealing). Other on-state performance, including $g_m$ and $G_{on}$, as well as FET morphology, did not substantially change after annealing.

Figure 13:
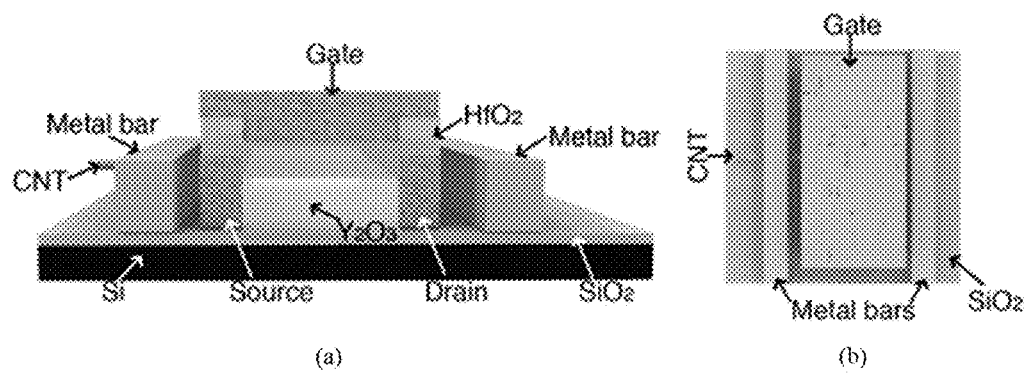
FIGS. 13(a) and 13(b) illustrate an example of a single-channel DNA-free CNT FET.
Figure 14:
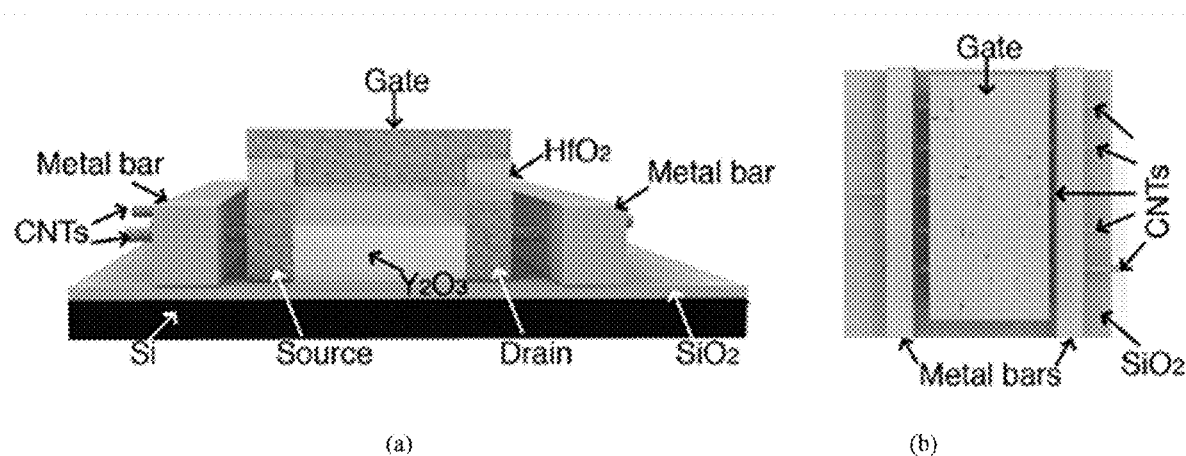
FIGS. 14(a) and 14(b) illustrate an example of a multi-channel DNA-free CNT FET.
Figure 17:
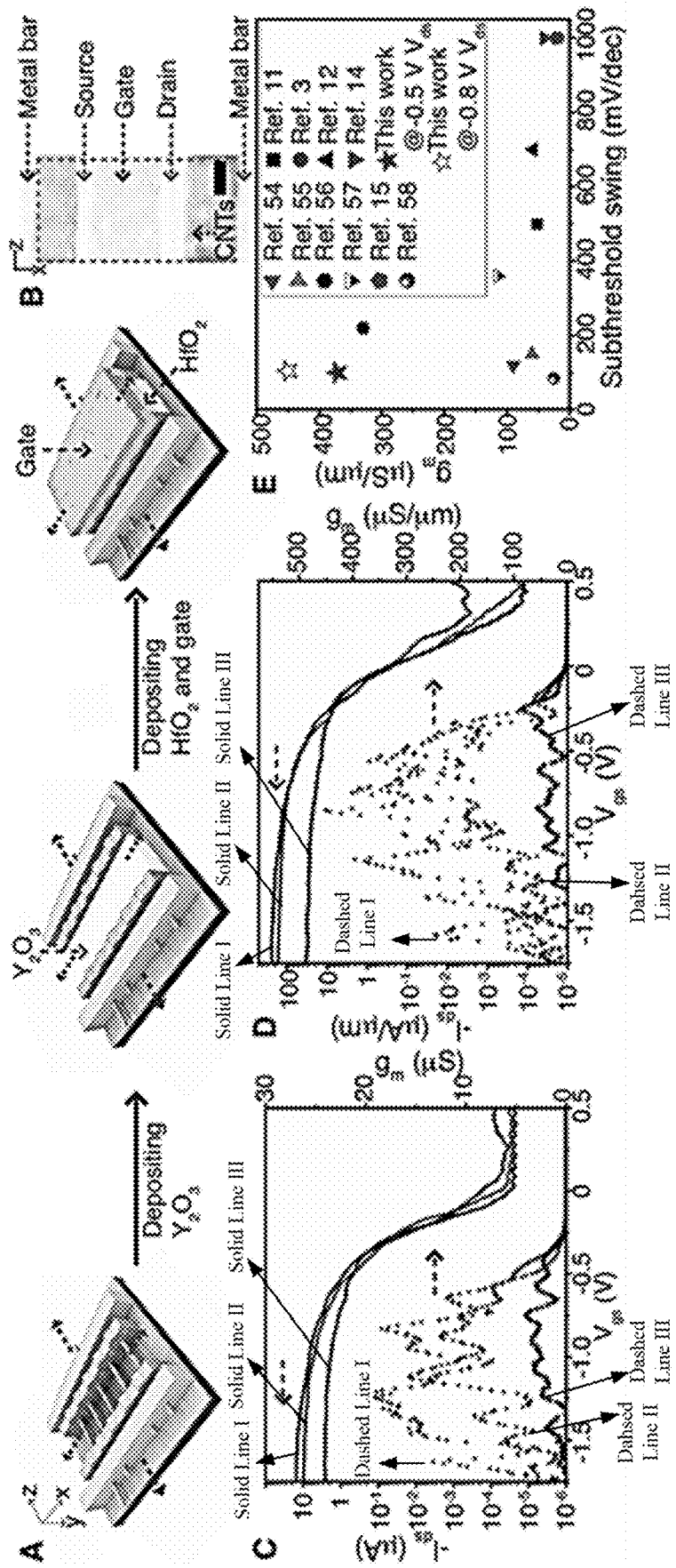
FIG. 17 shows constructing top-gated high-performance CNT FETs. (A) Design schematic for the fabrication of top-gated DNA-free FETs. (B) Zoomed-in SEM image along the x and z projection direction for the constructed multi-channel CNT FET. Dashed circle indicates the assembled CNT arrays. The scale bar is 100 nm. See also FIG. 26. (C and D) The $I_{ds}$-$V_{gs}$ curves (solid line, left axis, plotted in logarithmic scale) and $g_m$-$V_{gs}$ curves (dotted line, right axis, plotted in linear scale) for single-channel (C) and multichannel (D) CNT FETs. Lines I, Lines II and Lines III in C and D represent $V_{ds}$ of −0.8 V, −0.5 V, and −0.1 V, respectively. See also in FIGS. 25 and 27. (E) Benchmarking of current multichannel CNT FET in D with other reports of high-performance CNT FETs. Device performance from previous publications (References 3, 5, 16 to 18, 23 to 27) are obtained at $V_{ds}$ of −0.5 V and channel lengths ranging from 100 nm to 500 nm. See also in FIGS. 32 and 33.
Figure 25:
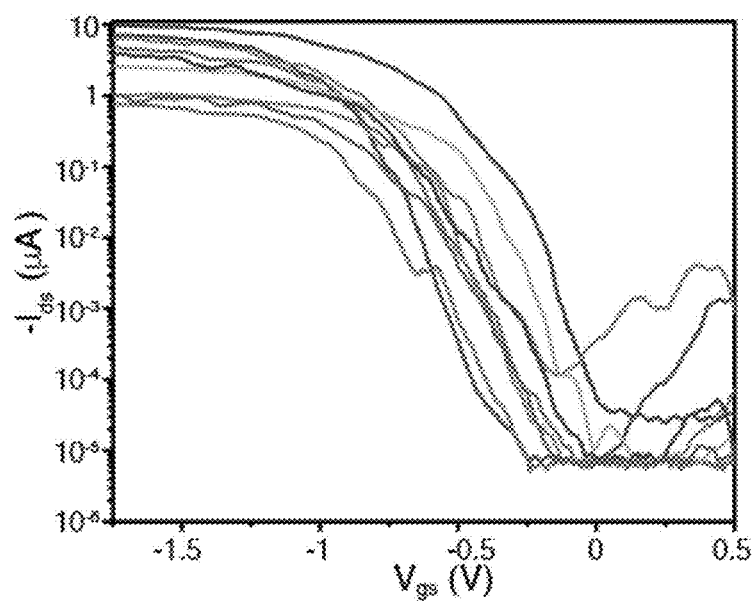
FIG. 25 shows the $I_{ds}$-$V_{gs}$ curves for all the operational single-channel DNA-free CNT FETs. Different lines represent distinct CNT FETs. The $V_{ds}$ was set at −0.5 V.
Figure 26:
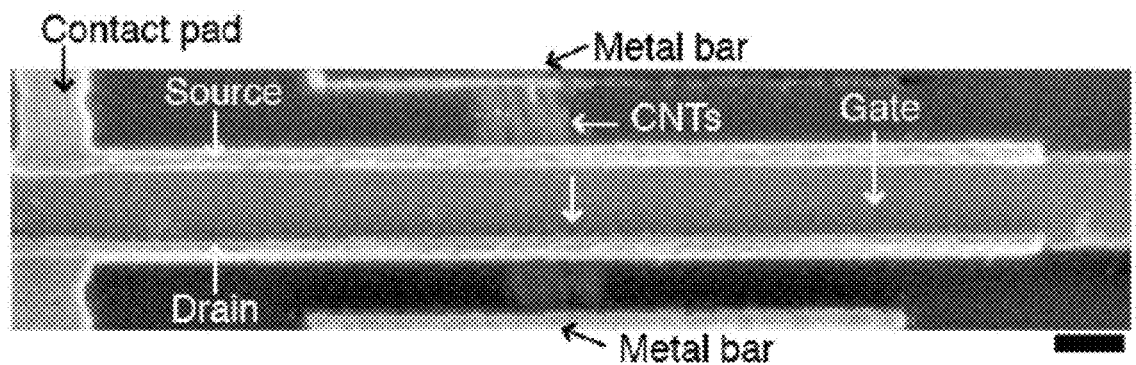
FIG. 26 shows zoomed-out SEM image of the constructed multichannel DNA-free CNT FET. The scale bar is 200 nm.
Figure 27:
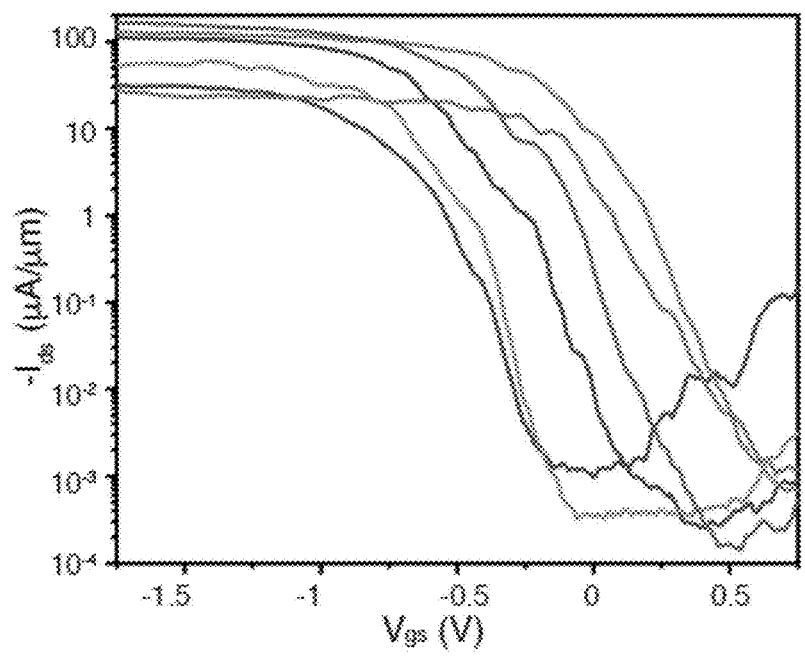
FIG. 27 shows the $I_{ds}$-$V_{gs}$ curves for all the operational multichannel DNA-free CNT FETs. Different lines represent distinct CNT FETs. $I_{ds}$ was normalized to the inter-CNT pitch. The $V_{ds}$ was set at −0.5 V.
Figure 30:
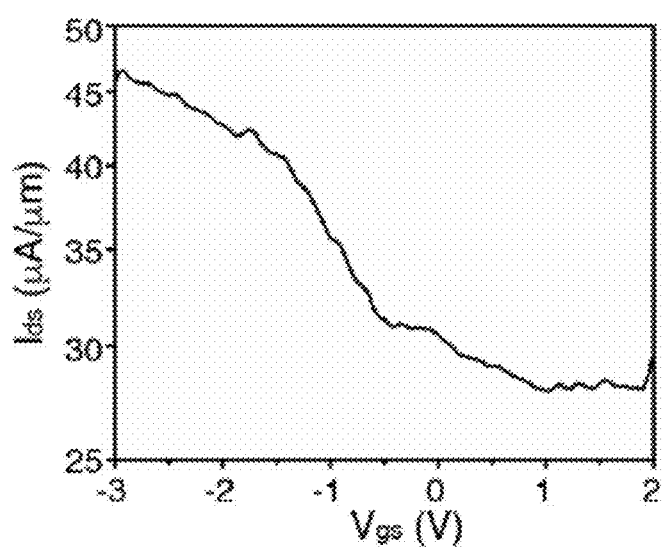
FIG. 30 shows the $I_{ds}$-$V_{ds}$ curve for the multichannel DNA-free CNT FET containing metallic CNT impurity. The $V_{ds}$ was set at −0.5 V. Ids was normalized to the inter-CNT pitch.

To build high-performance CNT FETs from biotemplates, we deposited a composite gate dielectric (Y₂O₃ and HfO₂) into the rinsed channel area, instead of introducing ssDNAs (FIGS. 17, A and B, FIGS. 14 and 26). Of all the FETs constructed, 54% (6 out of 11) showed gate modulation (FIG. 27). The other 5 out of 11 FETs contained at least one metallic CNT within the channel (FIG. 30). Using identical fabrication process, we also constructed another 9 operational single-channel DNA-free CNT FETs for comparing transport performance (FIG. 13). The single-channel CNT FET (channel length ~200 nm) with the highest on-state performance exhibited on-current of 10 μA/CNT ($V_{ds}$ of −0.5 V) at the thermionic limit of subthreshold swing (i.e. 60 mV/decade, FIG. 17C and FIG. 25).

Figure 28:
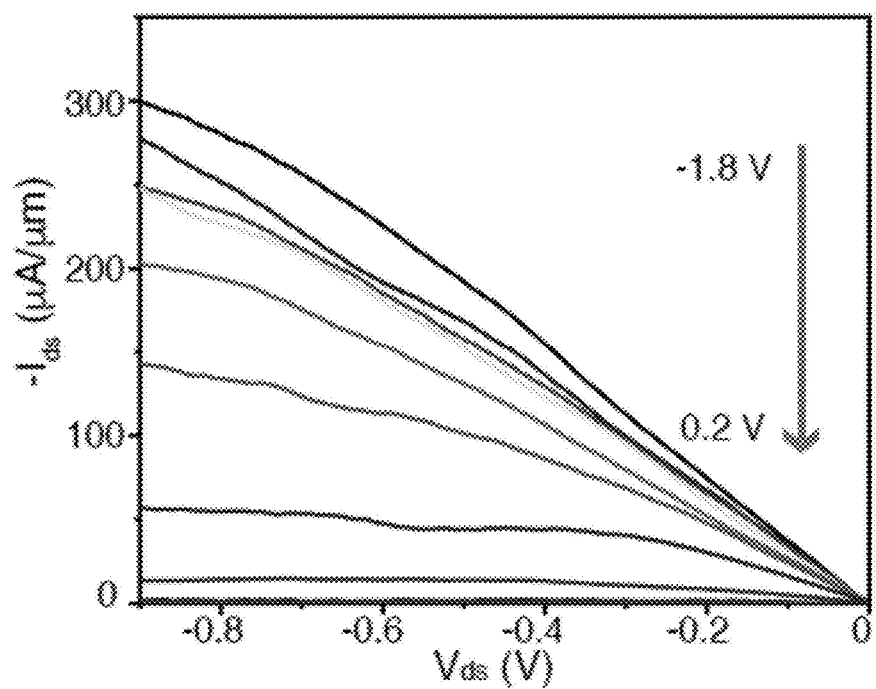
FIG. 28 shows the $I_{ds}$-$V_{ds}$ curves for the multichannel DNA-free CNT FET with highest on-current density at 200 nm channel length. Different lines represent distinct $V_{gs}$. $V_{gs}$ was ranging from −1.8 V to 0.2 V, at a step of 0.2 V. Ids was normalized to the inter-CNT pitch.

At $V_{ds}$ of −0.5 V, the multichannel DNA-free CNT FET (channel length ~200 nm, inter-CNT pitch of 24 nm) with highest on-state performance (FIG. 17D and FIG. 28) exhibited $V_{th}$ of −0.26 V, on-current density of 154 μA/μm (at $V_{gs}$ of −1.5 V), and subthreshold swing of 100 mV/decade. The $g_m$ and $G_{on}$ values were 0.37 mS/μm and 0.31 mS/μm, respectively. The noise in the $g_m$-$V_{gs}$ curve may originate from thermal noise and disorder and scattering within the composite gate construct. On-state current further increased to ~250 μA/μm, alongside with $g_m$ of 0.45 mS/μm and subthreshold swing of 110 mV/decade, at $V_{ds}$ of −0.8 V.

Figure 29:
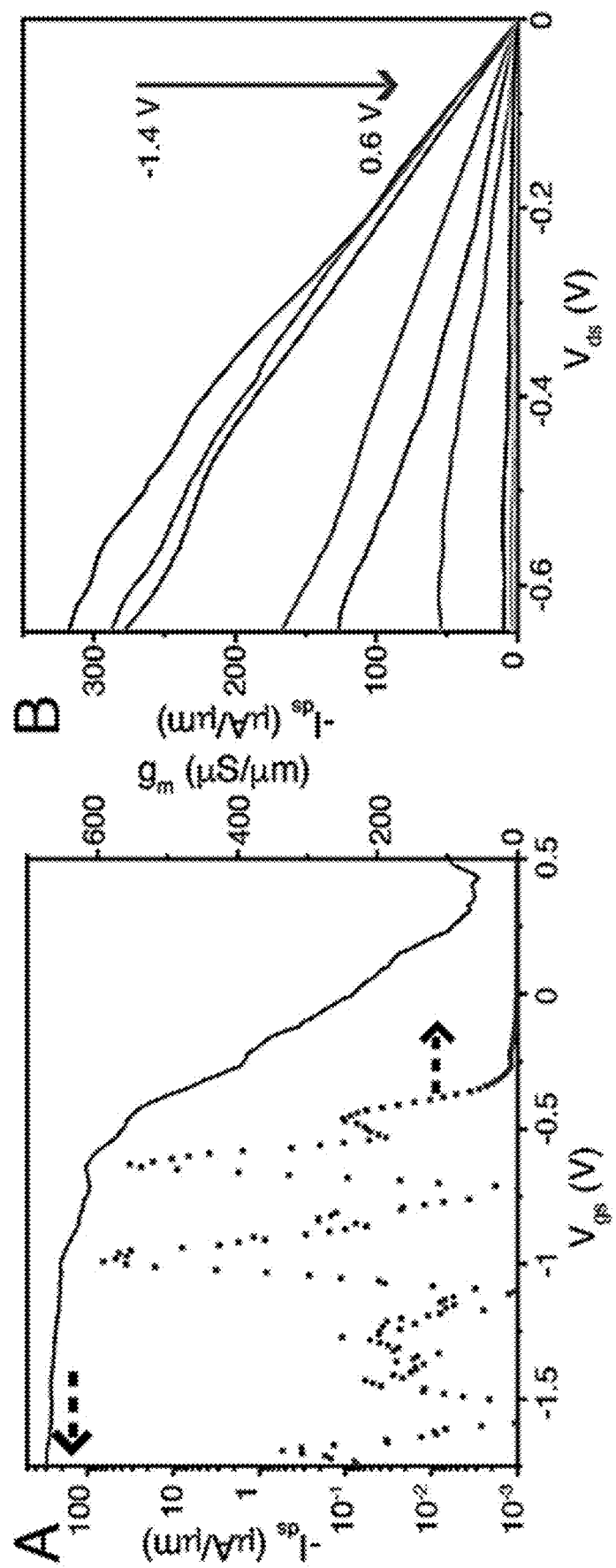
FIG. 29 shows the transport performance for the multichannel DNA-free CNT FET with 100-nm channel length. (A) $I_{ds}$-$V_{gs}$ curve (left axis, plotted in logarithmic scale) and $g_m$-$V_{gs}$ curve (right axis, plotted in linear scale) at $V_{ds}$ of −0.5 V. Both $I_{ds}$ and $g_m$ were normalized to the inter-CNT pitch. (B) $I_{ds}$-$V_{ds}$ curve. Different lines represent distinct $V_{gs}$. $V_{gs}$ was ranging from −1.4 V to 0.6 V, at a step of 0.2 V.

When the channel length scaled to 100 nm, we achieved on-current density of 300 μA/μm (at $V_{ds}$ of −0.5 V and $V_{gs}$ of −1.5 V), and subthreshold swing of 160 mV/decade (FIG. 29). Both the $G_{on}$ and the $g_m$ values were thus promoted to 0.6 mS/μm. The DNA-free CNT FETs exhibited comparable $I_{ds}$ to thin-film FETs from aligned chemical vapor deposition (CVD)-grown CNT arrays (Reference 28, Reference 29), even at 60% smaller CNT density (~40 CNTs/μm vs. more than 100 CNTs/μm in (Reference 28, Reference 29)). The effective removal of the contaminations, such as DNA and metal ions, and shorter channel length contributed to the high $I_{ds}$. Notably, a previous study fixed CNTs directly with the source and drain electrodes (Reference 13), but because contamination could not be fully removed from the electrode contact areas, the on-state performance ($g_m$ and $G_{on}$) decreased by a factor of 10.

Figure 32:
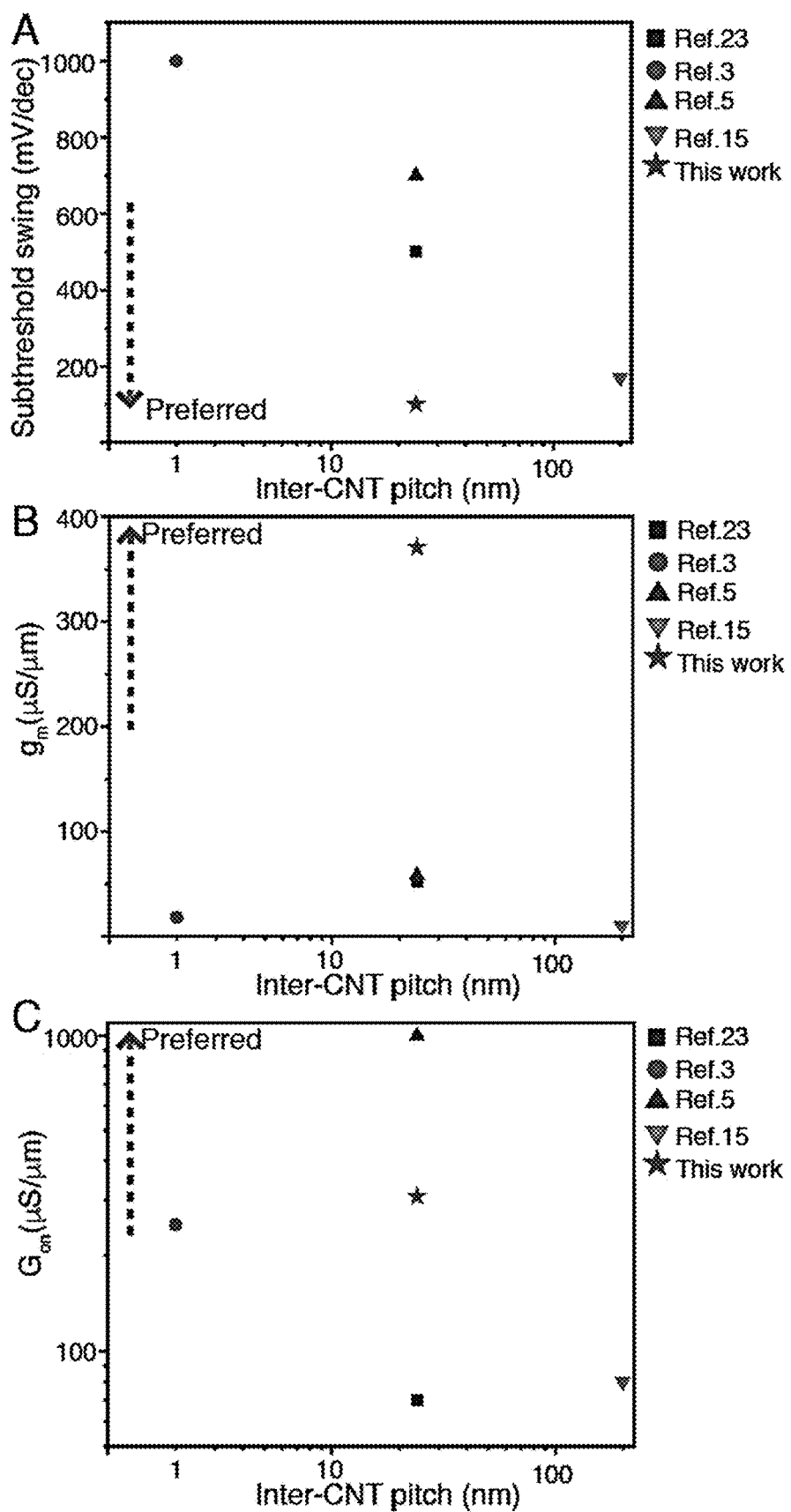
FIG. 32 shows benchmarking of CNT FETs with different inter-CNT pitches. Benchmarking of our multichannel CNT FET with other reports (even inter-CNT pitches) regarding: (A), subthreshold swing, (B), transconductance ($g_m$), and (C), on-state conductance ($G_{on}$). Device performance from previous publications (References 3, 5, 15, 23) are obtained at $V_{ds}$ of −0.5 V. Specifically, the transport performance are obtained from FIG. 4D in (Reference 23), FIGS. 4A and 4C in (Reference 3), FIGS. 2A and 2B in (Reference 5) and FIGS. 3C and 4B in (Reference 15). Channel lengths are ranging from 100 nm to 500 nm. In each panel, transport performance (i.e. subthreshold swing, on-state conductance, and transconductance) are plotted vs. structural parameter (inter-CNT pitch). High transport performance requires the demonstration of small subthreshold swing, high transconductance, and high on-state conductance simultaneously. Our multichannel CNT FET exhibits smallest subthreshold swing, highest transconductance, and $2^{nd}$ highest on-state conductance, compared to other FETs with different inter-CNT pitches.
Figure 33:
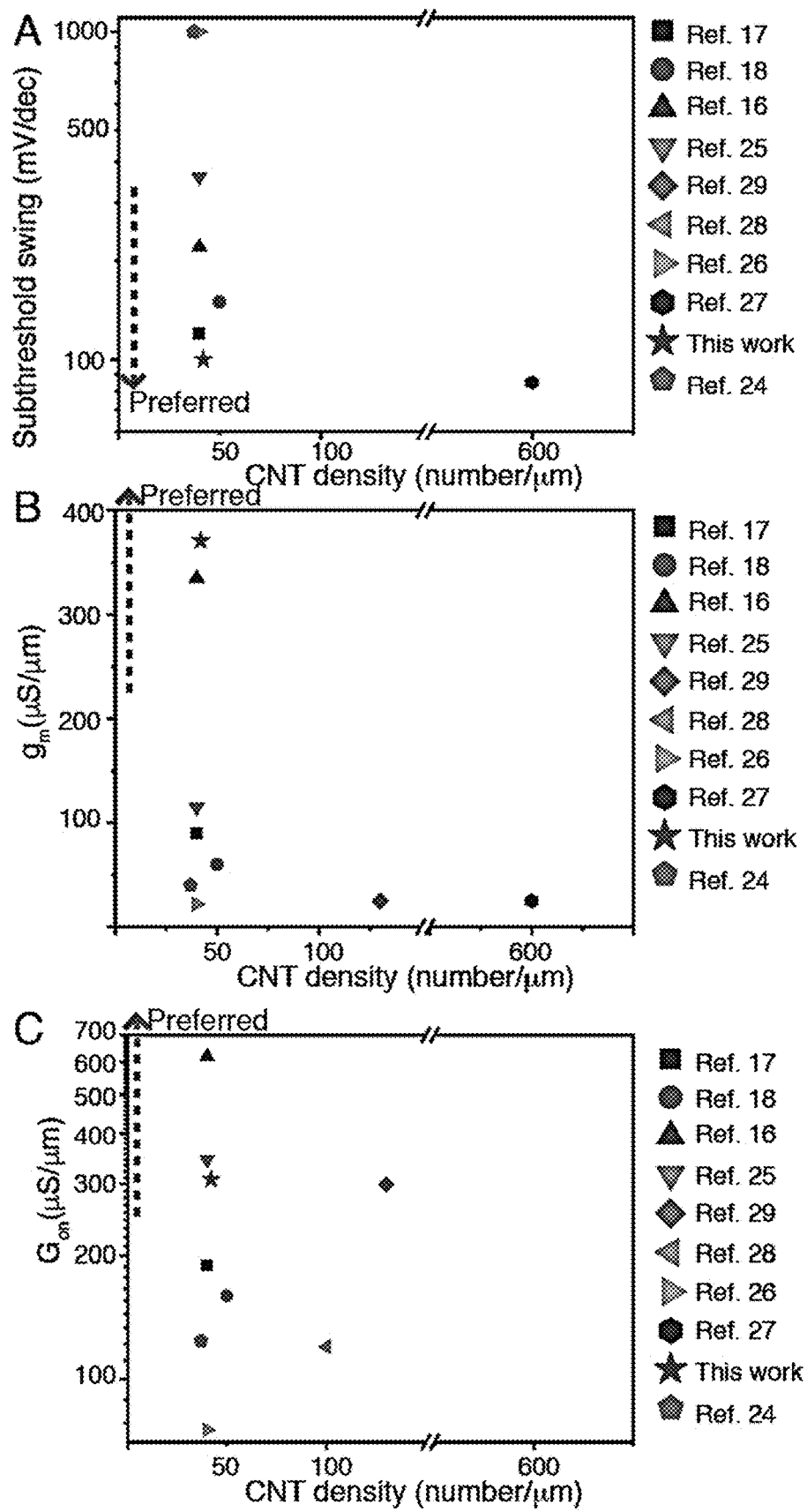
FIG. 33 shows benchmarking of CNT FETs with different CNT density. Benchmarking of our multichannel CNT FET with other reports on high density CNT arrays (uneven inter-CNT pitch) regarding: (A), subthreshold swing, (B), transconductance ($g_m$), and (C), on-state conductance ($G_{on}$). Device performance from previous publications (References 16-18, 24-29) are obtained at Vds of −0.5 V Specifically, the transport performance are obtained from FIG. 4D in (Reference 17), FIG. 1D in (Reference 18), FIG. 1F in (Reference 16), FIG. 2C in (Reference 25), FIG. 4A in (Reference 29), FIG. 11 in (Reference 28), FIG. 4B in (Reference 26), FIGS. 2B and 2D in (Reference 27), and FIG. 4C in (Reference 24). Channel lengths are ranging from 100 nm to 500 nm. In each panel, transport performance (i.e. subthreshold swing, on-state conductance, and transconductance) are plotted vs. structural parameter (CNT density). High transport performance requires the demonstration of small subthreshold swing, high transconductance, and high on-state conductance simultaneously. Our multichannel CNT FET exhibits $2^{nd}$ smallest subthreshold swing, highest transconductance, and $3^{rd}$ highest on-state conductance, compared to other FETs with different CNT density. Notably, FET with smallest subthreshold swing (Reference 27) exhibits an on-current density less than 5 uA/um, which does not meet the transport requirements of high-performance CNT FET.

At similar channel length and $V_{ds}$ (i.e. −0.5 V), we benchmarked current transport performance (i.e. $g_m$ and subthreshold swing) against conventional thin-film FETs using CVD-grown or polymer-wrapped CNTs (Reference 3, Reference 5, Reference 16-Reference 18, Reference 23-Reference 27) (FIG. 17E, FIGS. 32 and 33). Both high on-state performance ($g_m$ around 0.37 mS/μm) and fast on/off switching (subthreshold swing around 100 mV/decade) could be simultaneously achieved within the same solid-state DNA-templated FET; whereas thin-film CNT FETs with similar subthreshold swing (~100 mV/decade) exhibited more than 50% smaller $g_m$ (FIG. 32).

Figure 18:
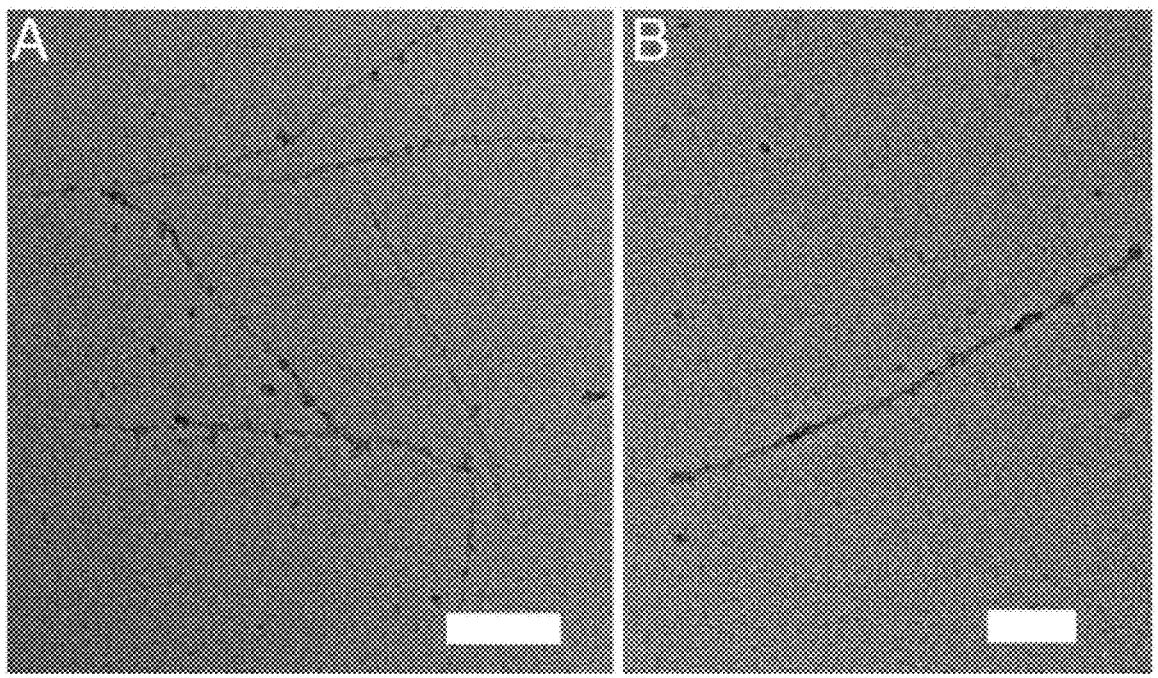
FIG. 18 shows zoomed-out (A) and zoomed-in (B) TEM images of the DNA-wrapped CNTs. The scale bar in A is 200 nm. The scale bar in B is 100 nm.
Figure 19:
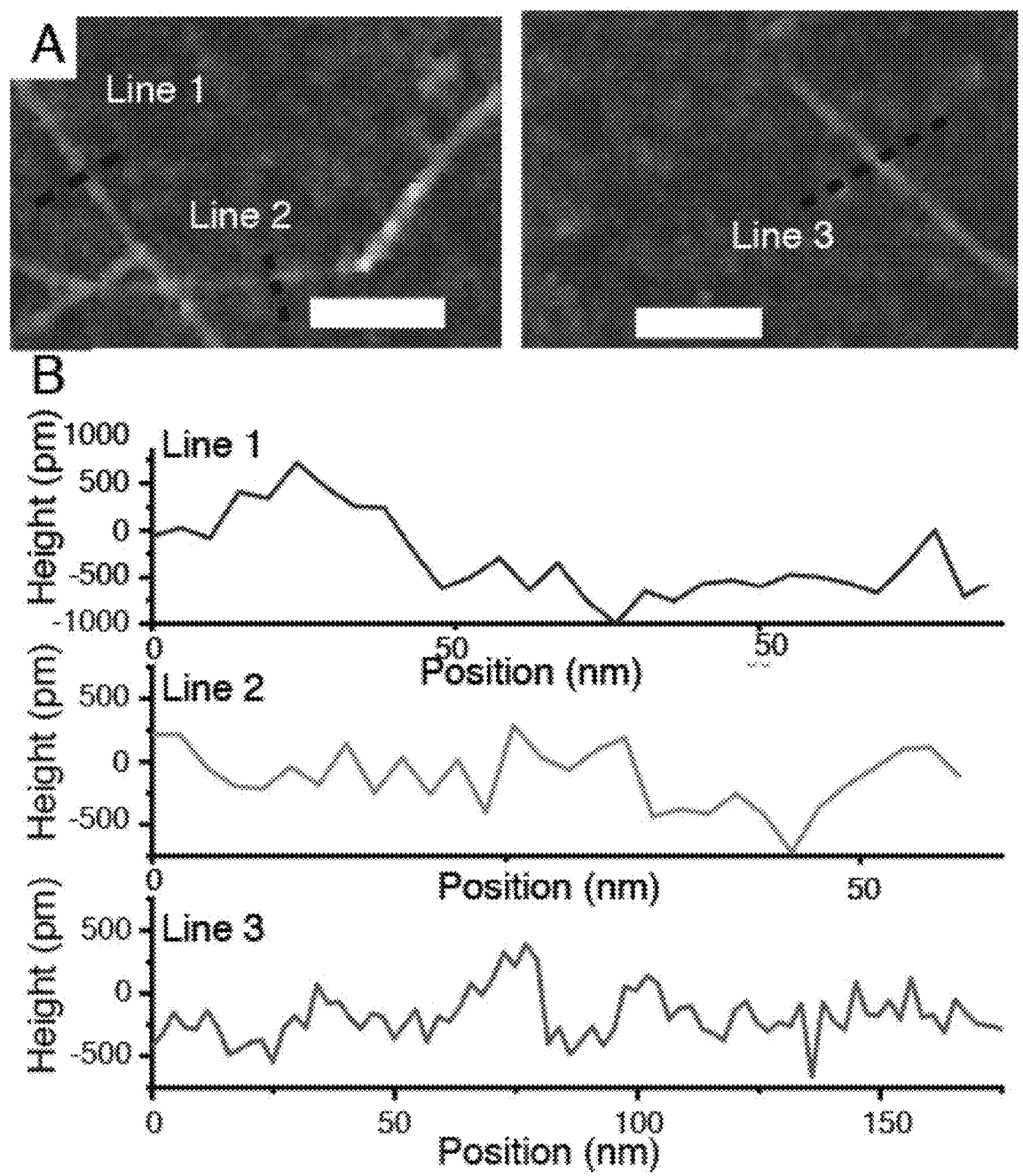
FIG. 19 shows height profile of CNTs. AFM images (A) and corresponding height profile (B) for three different CNTs. Dashed lines in (A) represent the positions for the height profiles in (B). The scale bar is 100 nm. As shown in the height profile, the CNT diameter distribution is ranging from less than 1 nm to ~1.5 nm.

Furthermore, the subthreshold swing difference between the multichannel (average value of 103 mV/decade) and the single-channel CNT FETs (average value of 86 mV/decade in FIG. 25) was reduced to 17 mV/decade. Theoretical simulations suggest that, under identical gate constructs, uneven diameter of CNTs (Reference 6) and the alignment disorder (including crossing CNTs) (Reference 5) raise the subthreshold swing (Reference 4). We observed a wide diameter distribution of the DNA-wrapped CNTs in AFM images (FIG. 19) and TEM images (FIG. 18). Hence, the small subthreshold swing difference above indicated the effective gate modulation and evenly-spaced CNT alignment using SHINE (Reference 12), i.e. the absence of crossing/bundling CNTs within the channel area.

Statistics over all the operational multichannel DNA-free FETs exhibited $V_{th}$ of −0.32±0.27 V, on-current density of 25 to 154 μA/μm (at $V_{ds}$ of −0.5 V and $V_{gs}$ of −1.5 V), and subthreshold swing of 103±30 mV/decade. Different amounts of narrow CNTs (i.e. diameter <1 nm) within FETs led to the wide distribution of the on-current density. Because the Schottky barrier and the band gap increase with narrower CNT diameter, lower CNT conductance is often observed than those with diameter above 1.4 nm (Reference 30, Reference 31).

When comparing the transport performance differences between DNA-containing and DNA-free FETs (FIG. 31), we observed largely negatively shifted $V_{th}$ (−2V versus −0.32 V), higher $I_{ds}$ at positive $V_{gs}$ (mostly 10 to 200 nA/μm versus 0.1 to 10 nA/μm), and more than one order of magnitude smaller $g_m$ (4 to 50 μS/μm versus 70 to 370 μS/μm). Thus, high-concentration ssDNAs within multichannel FETs deteriorated the transport performance. Thermal annealing did not fully eliminate the impact because of the presence of insoluble annealing products, such as metal phosphates (Reference 22).

Figure 34:
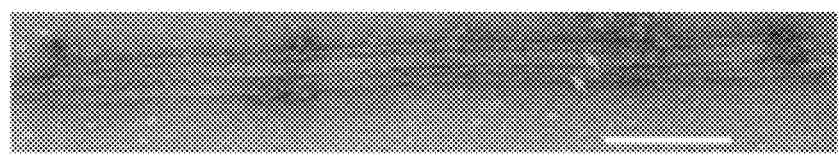
FIG. 34 shows zoomed-out TEM image for the assembled fixed-width CNT array with 16 nm inter-CNT pitch. Fixed-width DNA template exhibited a prescribed width around 34 nm. Arrows indicate the assembled CNTs on DNA templates. The scale bar is 100 nm.
Figure 35:
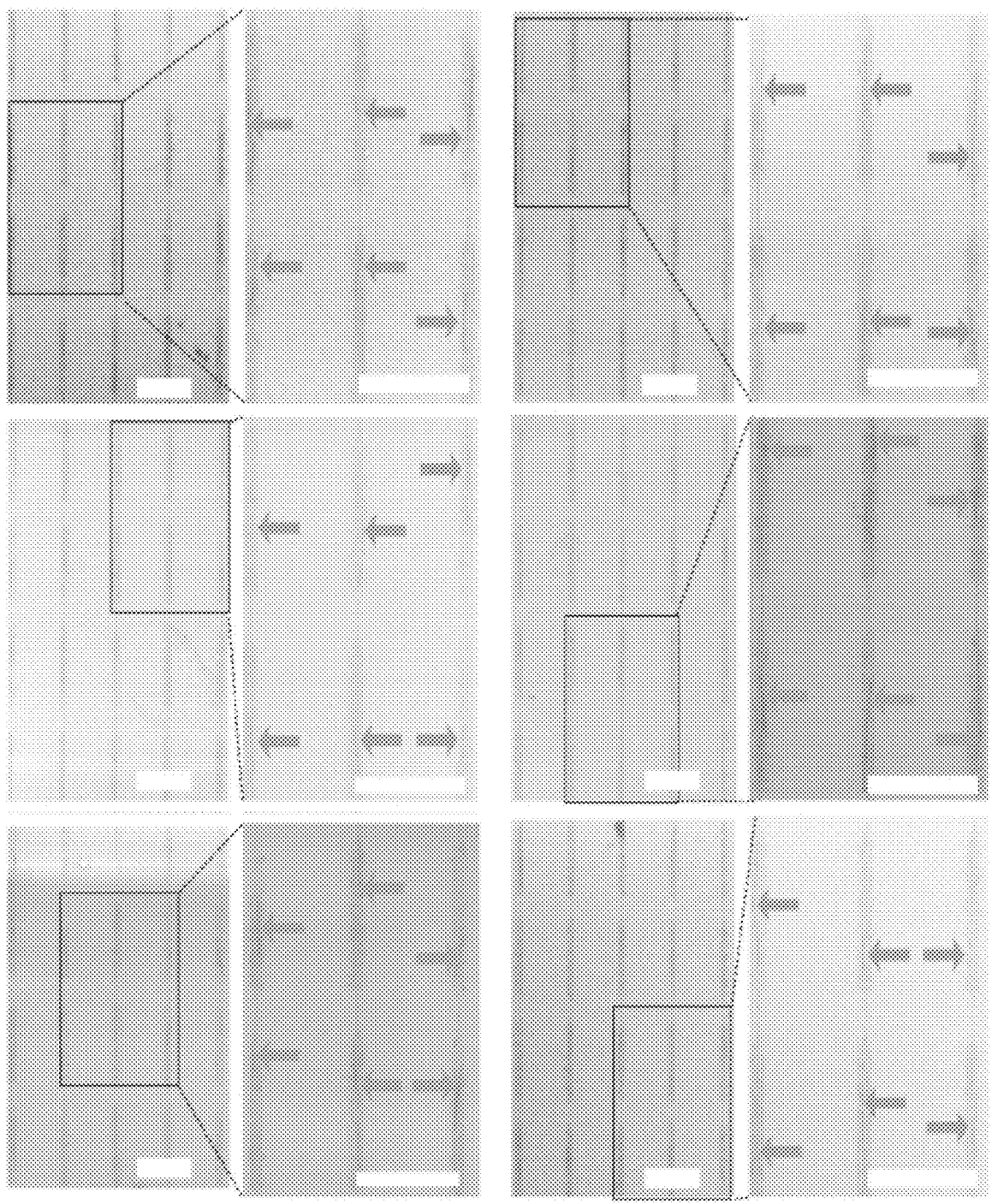
FIG. 35 shows SEM images for CNT-decorated DNA templates aligned on 120 cavities. The rectangular circles in the zoomed-out SEM images indicate the zoomed-in position. The arrows in the zoomed-in SEM images indicate the aligned DNA templates. The scale bars are 2 um.

When CNT-decorated DNA templates were deposited onto a flat Si wafer, random orientations of DNA templates were formed through unconfined surface rotation. We solved this issue by using 3D polymeric cavities to confine the surface orientation during large-area placement. We first assembled fixed-width CNT arrays (FIG. 34) with prescribed inter-CNT pitch of 16 nm (2 CNTs per array). Next, in a typical 500 μm by 500 μm write-field on the PMMA-coated Si substrate (more than 20 write-fields on 0.35 cm² substrate), we fabricated densely-aligned crenellated parapet-like PMMA cavities (cavity density ~2×10⁷ cavities/cm²). The minimum and the maximum designed widths along z direction were 180 and 250 nm, respectively.

After DNA deposition and PMMA liftoff (FIG. 8 (B)), >85% of the initial cavities (~600 cavities were counted) were occupied by DNA templates (FIG. 8 (B), FIG. 25). The measured angular distribution, defined as the difference between the longitudinal axis of the DNA templates and the x direction of the substrate, was 56% within ±1° and 90% within ±7° (FIG. 8 (B)), per scanning electron microscopy (SEM)-based counting of all of the remaining DNA templates within the 600 cavity sites. This value included improvable impacts from the fabrication defects of PMMA cavities sites, the variation during DNA placement, and any disturbance from PMMA liftoff. Notably, the angular distribution was still improved compared to previous large-scale placement of DNA-templated materials (Reference 19). CNTs were not visible under SEM, because they were embedded within the DNA trenches and shielded from the SEM detector by DNA helices.

Figure 36:
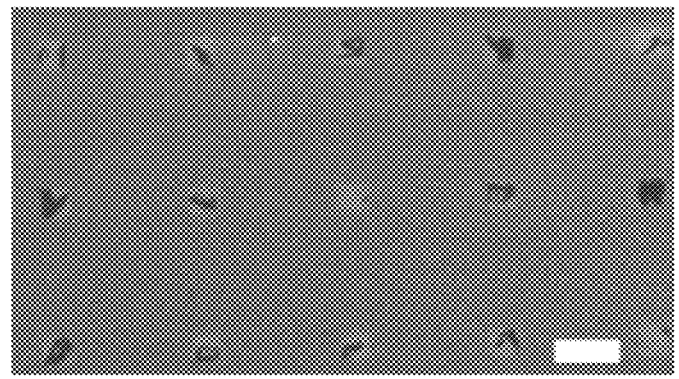
FIG. 36 shows SEM image for DNA templates placed within the rectangular PMMA cavity sites. The width of the PMMA cavities was designed as 2 um at a length-to-width aspect ratio of 1. The scale bar is 4 um.

Both the lengths of the DNA templates and the aspect ratio of the PMMA cavities affected the angular distribution. Longer DNA templates (length >1 μm) exhibited narrower angular distribution (0°±3.4° in FIG. 8 (B)) than those of shorter DNA templates (length <500 nm, 1°±11° in FIG. 8 (B)). In addition, PMMA cavities with higher length-to-width aspect ratio (i.e. 10 in FIG. 8 (B)) provided better orientation controllability than those with lower aspect ratio (i.e. 1 in FIG. 36). Hence, to further improve the angular distribution, longer DNA templates, as well as higher length-to-width aspect ratio of PMMA cavities, were beneficial. Because PMMA cavities were wider than the DNA templates, we observed up to 3 DNA templates, as well as the offset of DNA templates along the x and z directions, within a few PMMA cavities. Notably, DNA templates did not fully cover the PMMA cavities, even for a saturated DNA solution.

Figure 37:
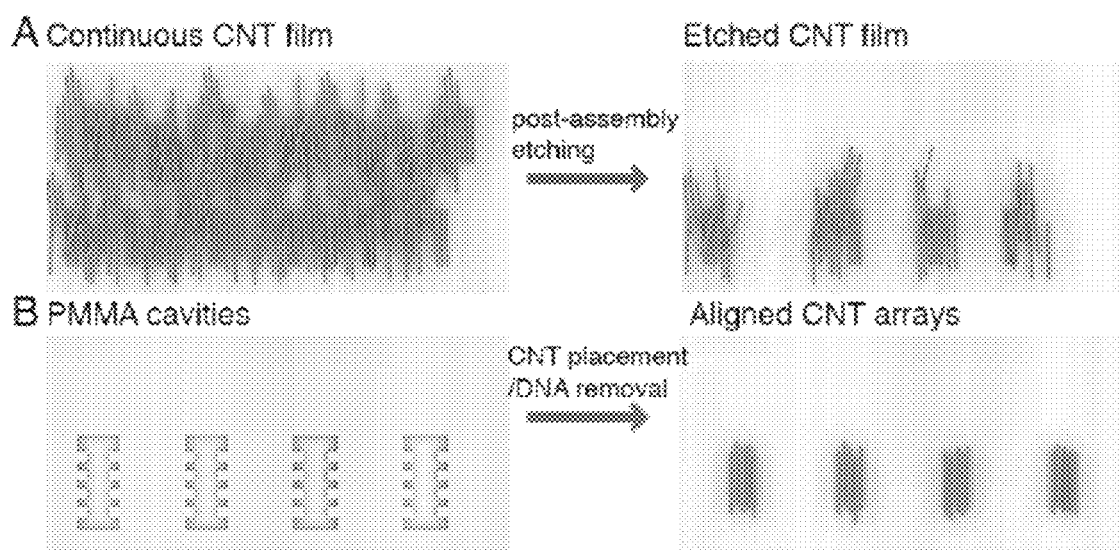
FIG. 37 shows different approaches for preparing CNT arrays with designer array width, inter-array spacing and CNT counts over centimeter-scale. (A) continuous CNT film (with random orientations) is processed with a post-assembly etching step to produce designer array width/inter-array spacing/CNT counts. (B) placing fixed-width CNT arrays (assembled using 3D DNA nanotrenches) within the pre-fabricated PMMA cavities, followed by PMMA liftoff and DNA removal, could directly produce designer array geometries without a post-assembly etching.

Two-dimensional hydrophilic surface patterns, with shape and dimensions identical to the DNA structures, could direct the orientation of the deposited DNA structures (Reference 32). However, it is difficult to design patterns adaptive to DNA templates with variable lengths. In contrast, effective spatial confinement relies mainly on the lengths of the DNA templates and the aspect ratio of PMMA cavities, and is applicable to irregular template lengths. Therefore, the anisotropic biotemplated CNT arrays could be aligned along the longitudinal direction of the cavities (FIG. 37).

To further promote the on-state performance, scaling the inter-CNT pitch into sub-10 nm may be beneficial. However, at 2 nm inter-CNT pitch, the enhanced electrostatic interactions may impact the on/off switching. Therefore, the correlation between the inter-CNT pitch and performance metrics of CNT FETs needs to be verified. Combined with large-area fabrications via conventional lithography and directed assembly of block copolymers, biomolecular assembly could provide a high-resolution paradigm for programmable electronics over large area. The hybrid electronic-biological devices may also integrate electrical stimuli and biological input/outputs, producing ultra-scaled sensors or bio-actuators.

Materials and Experimental Methods for the Example

1. Atomic Force Microscopy (AFM)

7 uL as-prepared CNT-decorated DNA templates solution was deposited onto a 1-cm² sized silicon chip followed by stepwise rinsing in 50%, 95%, and 99.5% ethanol. The sample was imaged on a Multimode SPM (Vecco) via tapping mode.

2. Scanning Electron Microscopy (SEM)

7 uL as-prepared CNT-decorated DNA templates solution was deposited onto a 1-cm² sized silicon chip followed by stepwise rinsing in 50%, 95%, and 99.5% ethanol. The dried silicon chip was imaged on a HITACHI S-4800 system operated at 5 kV under high vacuum.

3. Transmission Electron Microscopy (TEM)

0.6 uL as-prepared (without purification) CNT-decorated DNA templates was diluted into 5 uL water and adsorbed onto glow discharged carbon-coated TEM grids for 4 min. Then the remaining solution was wiped away, followed by negative staining using 6 uL 2% aqueous uranyl formate solution (7 sec) and a quick water rinsing. Imaging was performed using an JEOL 2100 operated at 120 kV 4. Centimeter-Scale Oriented Placement A 0.35-cm² sized silicon substrate was firstly spin-coated with poly(methyl methacrylate) (PMMA) resist (Allresist AR-P 672.045) and patterned using electron-beam lithography (Raith Voyager, with an exposure dose of 325 uC/cm² at 0.9 nA current). The patterned PMMA layer was developed in a 1:3 mixture of methylisobutyl ketone (MIBK) and isopropyl alcohol (IPA), followed by rinsing with IPA and drying with nitrogen. The solution of CNT-decorated DNA templates was dipped onto the lithography-defined patterns. Then the silicon substrate was kept in a sealed chamber for 2 hours. During this process, the DNA templates diffused into the PMMA cavities. Si substrate was then dried, followed by PMMA liftoff, leaving only the aligned DNA templates on the flat Si substrate. Finally, we imaged the sample with SEM.

5. Removing DNA Templates

We applied the following process to remove the assembled DNA templates while retaining CNT alignment: (1) fabricating alignment markers on Si wafer with electron-beam lithography; (2) depositing the CNT-decorated DNA templates onto Si wafer and registering the positions with low-magnification SEM; (3) fabricating metal bars to fix the assembled CNT arrays onto Si wafer; and (4) removing DNA templates by continuously water and $H_2O_2$ rinsing. We used the length-sorted CNTs (semiconducting purity >95%) from NIST, and the length range was 300-1000 nm.

Alignment Marker:

A 230-nm thick PMMA layer was spun onto Si wafer (with 300-nm thick $SiO_2$ on top) and the fine alignment marker pattern was written using Raith Voyager system (at a current of 9 nA and a dose of 780 uC/cm²). The alignment marker pattern was developed in a 1:3 mixture of MIBK and IPA. A stacking titanium/gold film (5-nm thick titanium and 45-nm thick gold) was deposited using DE400 e-beam evaporation system. Liftoff was performed at room temperature in acetone without sonication, followed by an ethanol rinsing. The sample was dried with nitrogen.

CNT Deposition and Registration:

A 9 uL solution of the assembled CNT-decorated DNA templates was dipped onto the oxygen plasma-cleaned marked Si wafer, followed by the incubation at room temperature for 1 hour. After that, the remaining solution was blown away with nitrogen. The Si wafer was sequentially rinsed with 75%, 95%, and 99% ethanol, followed by air drying. The Si wafer was then imaged under SEM at low magnification (operated at 1 kV). The positions of the CNT-decorated DNA templates were registered relative to the alignment markers.

CNT Fixing and DNA Removal:

A 230-nm thick PMMA layer was spun onto the CNT-deposited Si wafer. The metal bar pattern was written using Raith Voyager system (at a current of 400 pA and a dose of 750 uC/cm$^2$). The metal bar pattern was developed in a 1:3 mixture of MIBK and IPA. A stacking film of 5-nm thick titanium and 60-nm thick gold was deposited using DE400 e-beam evaporation system. Liftoff was performed at room temperature in acetone without sonication, followed by an ethanol rinse. The sample was dried with nitrogen. DNA removal was then performed by sequential water and H$_2$O$_2$ (5%) rinsing.

6. FET Construction

For FET construction, we used electron beam lithography for fabricating the source/drain/gate electrodes onto the assembled CNT arrays and constructing the electrical contact pads.

Source/Drain Electrodes:

A 230-nm thick PMMA layer was spun onto the cleaned CNT arrays, followed by writing the source and the drain electrodes patterns with Raith Voyager system (at a current of 400 pA and a dose of 750 uC/cm$^2$). The source and the drain electrodes patterns were developed in a 1:3 mixture of MIBK and IPA. A stacking film of 0.5-nm thick titanium, 30-nm thick palladium, and 40-nm thick gold was deposited using DE400 e-beam evaporation system. Liftoff was performed at room temperature in acetone without sonication, followed by an ethanol rinsing. The sample was dried with nitrogen.

Gate Electrode:

Next, a layer of 230-nm thick PMMA layer was spun onto the Si wafer, followed by writing the channel patterns with Raith Voyager system (at a current of 400 pA and a dose of 750 uC/cm$^2$). One-nm thick yttrium metal film was first deposited using DE400 e-beam evaporation system. Liftoff was performed at 70° C. in acetone. Then, the yttrium film was oxidized in the air at 250° C.

A 230-nm thick PMMA layer was then spun onto the Y$_2$O$_3$-coated Si wafer, followed by writing the gate electrode pattern with Raith Voyager system (at a current of 400 pA and a dose of 750 uC/cm$^2$). The gate electrode pattern was developed in a 1:3 mixture of MIBK and IPA. Eight-nm thick HfO$_2$ was next deposited via atomic layer deposition (Beneq) at 90° C. A 15-nm thick palladium film was finally deposited using DE400 e-beam evaporation system. Liftoff was performed at room temperature in acetone without sonication, followed by ethanol rinsing. The sample was dried with nitrogen.

Contact Pads:

For fabricating large electrical contact pads connecting to the electrodes, a 230-nm thick PMMA layer was first spun onto the sample. Contact pad pattern was exposed using Raith Voyager system (at a current of 9 nA and a dose of 750 uC/cm$^2$). The contact pad pattern was developed in a 1:3 mixture of MIBK and IPA, then dried with nitrogen. A stacking film of 5-nm thick titanium and 70-nm thick gold was deposited using DE400 e-beam evaporation system. Liftoff was performed at room temperature in acetone without sonication, followed by ethanol rinsing. And the sample was dried with nitrogen.

Electrical Measurements for CNT FETs:

The electrical measurements for the constructed CNT FETs were performed at room temperature in a probe station connected to a Keithley 4200 SCS Semiconductor Device Analyzer.

7. Introducing ssDNAs at Channel Interface

After fabricating the source/drain electrodes, we applied the following process to introduce ssDNAs at channel interface and construct the gate dielectric accordingly: (1) a 230-nm thick PMMA layer was spun onto the wafer, followed by writing the gate electrode pattern with Raith Voyager system (at a current of 400 pA and a dose of 750 uC/cm$^2$). The gate electrode pattern was developed in a 1:3 mixture of MIBK and IPA; (2) 10 uL solution of L1 (1 uM) was dipped onto the fixed CNT arrays, and incubated at room temperature for 1.5 h; (3) the remaining solution was blown away with nitrogen, followed by sequentially rinsing with 75%, 95%, and 99% ethanol; (4) 9-nm thick HfO$_2$ medium was grown within the developed pattern via atomic layer deposition (Savannah) at 90° C. A 15-nm thick palladium film was deposited using DE400 e-beam evaporation system. Liftoff was performed at room temperature in acetone without sonication, followed by ethanol rinsing. The sample was dried with nitrogen.

After that, the contact pads and the electrical measurements were performed using identical approaches above in Section "FET construction".

Further Optimizations of FET Performance for the Example

To further improve the FET performance, it is necessary to increase the on-state conductance while lower the subthreshold swing.

Towards higher on-state conductance, several strategies have been suggested in previous reports. For example, when applying the gate overdrive ($V_{gs}$–$V_{th}$) up to 6 V, on-current density around 0.5 mA/um has been reported (at 100 nm $L_{ch}$) (Reference 5). However, at ultra-scaled technology nodes, the supply voltage ($V_{dd}$) is typically below 1 V, which limits the available voltage range of $V_{gs}$. Meanwhile, raising CNT density to 500 CNTs/um, as well as scaling the channel length to 10 nm, could also provide oncurrent density of 0.8 mA/um (at gate overdrive around 3 V) (Reference 6). But high CNT density also presents challenges in promoting the conductance per CNT, because of the strong inter-CNT screening effect at high CNT density. As a result, the on-state conductance per CNT is lowered to less than 2 uA/CNT, around 10% of the single-channel CNT FET at identical channel length (Reference 33). Besides, subthreshold swing around 500 mV/decade is produced due to the destructive crossing CNTs and diameter distribution at high CNT density. Using 3D DNA nanotrenches, the formation of crossing CNTs could be minimized. Hence, by exploring the correlation between inter-CNT pitch and the on-state conductance, the optimized inter-CNT pitch could balance the competing needs on higher CNT density and lower inter-CNT interactions. Together with the short channel design, the on-state conductance of multichannel CNT FETs will be maximized.

Decreasing the subthreshold swing to 60-80 mV/decade is recommended by the International Technology Roadmap for Semiconductors (Reference 1). Notably, decreasing the subthreshold swing should not degrade the on-state conductance. In the CNT FETs constructed from thin-film CNT arrays, subthreshold swing of 60 mV/decade has been reported (Reference 34). However, the on-current density is as small as 100 nA/um, and does not meet the requirements of high-performance electronics. Based on our demonstration, the subthreshold swing of the multichannel CNT FETs is slightly higher than that of single-channel CNT FETs. Because of the absence of crossing CNTs, the small difference value (17 mV/decade) is ascribed to the diameter distribution. Hence, when CNTs with uniform diameter are available, 3D DNA nanotrenches could in principle build multichannel CNT FETs with subthreshold swing identical to the single-channel CNT FETs. Further decreasing the subthreshold swing to the thermionic limit of 60 mV/decade or even smaller relies on the gate efficiency. For instance, using a graphene-contacted design, single-channel CNT FETs have been demonstrated with both subthreshold swing of sub-60 mV/decade and on-state current of 8 uA/CNT (Reference 35). Integrating the graphene-contacted design within multichannel CNT FETs may promote the on/off switching than current metal contacts.

Higher CNT purity is also necessary for improving the successful rate of FET construction. For the projected CNT FET architecture, 95% semiconducting CNT purity produces 73% successful rate in the six-channel CNT FETs, and 54% successful rate in the twelve-channel FETs. Considering high-performance micro-processors contain up to 1 billion FETs, a semiconducting CNT purity higher than 99.99999998% is necessary to ensure all the FETs are operational.

Fabricating CNT Arrays with Designer Width and Inter-Array Spacings for the Example In digital circuits, it is quite common to have larger spacing values outside individual FETs than the semiconductor channel pitch. In Si circuits, for example, Samsung's 14 nm technology node has a uniform fin pitch of 49 nm (FET width is less than 250 nm); whereas the spacing between two nearest fins in neighboring FETs can be as large as 700 nm, 13 times larger than the fin pitch. Similar spacing differences have also been observed in Intel's 22 nm, 14 nm, and 10 nm Si technology nodes. The larger spacing between two nearest FETs may accommodate the interconnect metal wires. And the larger inter-FET spacing is adjustable tailored to different circuit architectures.

Existing thin-film approaches employ a post-assembly etching approach to prepare arrays with designer width, inter-array spacings, and CNT counts over centimeter-scale. Continuous CNT film first covers the entire surface of the substrate. Then a postassembly etching (via oxygen plasma) is introduced to etch away CNTs out of the channel area (FIG. 37A). Hence, both array width and inter-array spacing could be fabricated tailored to FET/circuit layouts. Importantly, inter-array spacing is necessary to prevent stray conducting pathways (Reference 37) and accommodate metal contacts. It has been reported that the presence of CNTs beneath the contacts lowers the adhesion of metal contacts to the substrate surface (Reference 6). After the post-assembly etching, full surface coverage CNT films are etched into several individual arrays with width around 50 nm to a few hundred nanometers, tailored to FET layouts.

In comparison, we demonstrate a different strategy to achieve the designer width, inter-array spacings, and CNT counts in the manuscript (FIG. 37B). Using 3D DNA nanotrenches, CNT arrays are assembled with designer inter-CNT pitches and CNT counts on fixed-width 3D DNA templates. And the CNT counts per array could be programmed by different template widths. The assembled CNT arrays are then placed within the pre-fabricated PMMA cavities, followed by PMMA liftoff and DNA removal. Without post-assembly etching, prescribed inter-array spacing is demonstrated after the centimeter-scale oriented placement. Because the inter-array spacing is defined by lithography of PMMA cavities, in principle, it could be further scaled to sub-200 nm. Therefore, the maximum array density is around $10^5$/cm, close to that of Si fins at 10-nm technology node (less than $3*10^5$/cm). The array width and inter-array spacing from our approach are also similar to those fabricated from the post-assembly etching approach.

REFERENCES FOR THE EXAMPLE

1. *The International Technology Roadmap for Semiconductors:* 2013.
2. G. Hills et al., Understanding energy efficiency benefits of carbon nanotube field-effect transistors for digital VLSI, *IEEE Trans. Nanotech.* 17, 1259-1269 (2018).
3. Q. Cao et al., Arrays of single-walled carbon nanotubes with full surface overage for high-performance electronics, *Nature Nanotech.* 8, 180-186 (2013).
4. G. J. Brady, K. R. Jinkins, M. S. Arnold, Channel length scaling behavior in transistors based on individual versus dense arrays of carbon nanotubes, *J. Appl. Phys.* 122, 124506 (2017).
5. G. J. Brady et al., Quasi-ballistic carbon nanotube array transistors with current density exceeding Si and GaAs, *Sci. Adv.* 2, e1601240 (2016).
6. Q. Cao, J. Tersoff, D. B. Farmer, Y Zhu, S.-J. Han, Carbon nanotube transistors scaled to a 40-nanometer footprint, *Science* 356, 1369-1372 (2017).
7. H. A. Becerril, A. T. Woolley, DNA-templated nanofabrication, *Chem. Soc. Rev.* 38, 329-337 (2009).
8. M. R. Jones, N. C. Seeman, C. A. Mirkin, Programmable materials and the nature of the DNA bond, *Science* 347, 1260901 (2015).
9. S.-P. Han, H. T. Maune, R. D. Barish, M. Bockrath, W. A. Goddard, III, DNA-linker-induced surface assembly of ultra dense parallel single walled carbon nanotube arrays, *Nano Lett.* 12, 1129-1135 (2012).
10. A. Mangalum, M. Rahman, M. L. Norton, Site-specific immobilization of single-walled carbon nanotubes onto single and one-dimensional DNA origami, *J. Am. Chem. Soc.* 135, 2451-2454 (2013).
11. H. Pei et al., Organizing end-site-specific SWCNTs in specific loci using DNA, *J. Am. Chem. Soc.* 141, 11923-11928 (2019).
12. W. Sun et al., Precise pitch-scaling of carbon nanotube arrays within three-dimensional DNA nanotrenches, *Science* (2020).
13. H. T. Maune et al., Self-assembly of carbon nanotubes into two-dimensional geometries using DNA origami templates, *Nature Nanotech.* 5, 61-66 (2010).
14. K. Keren, R. S. Berman, E. Buchstab, U. Sivan, E. Braun, DNA-templated carbon nanotube field-effect transistor, *Science* 302, 1380-1382 (2003).
15. S.-J. Han et al., High-speed logic integrated circuits with solution-processed self-assembled carbon nanotubes, *Nature Nanotech.* 12, 861-865 (2017).
16. D. Zhong et al., Gigahertz integrated circuits based on carbon nanotube films, *Nature Electron.* 1, 40-45 (2018).
17. C. Zhao et al., Exploring the performance limit of carbon nanotube network film field-effect transistors for digital integrated circuit applications, *Adv. Funct. Mater.* 29, 1808574 (2019).
18. L. Liu et al., Carbon nanotube complementary gigahertz integrated circuits and their applications on wireless sensor interface systems, *ACS Nano* 13, 2526-2535 (2019).
19. A. M. Hung et al., Large-area spatially ordered arrays of gold nanoparticles directed by lithographically confined DNA origami, *Nature Nanotech.* 5, 121-126 (2010).
20. N. Nakatsuka et al., Aptamer-field-effect transistors overcome Debye length limitations for small-molecule sensing, *Science* 362, 319-324 (2018).

22. F. Zhou et al., Programmably shaped carbon nanostructure from shape-conserving carbonization of DNA, *ACS Nano* 10, 3069-3077 (2016).
23. Q. Cao, S.-J. Han, G. S. Tulevski, Fringing-field dielectrophoretic assembly of ultrahigh-density semiconducting nanotube arrays with a self-limited pitch, *Nature Commun.* 5, 5071 (2014).
24. J. Wu et al., Self-assembly of semiconducting single-walled carbon nanotubes into dense, aligned rafts, *Small* 9, 4142-4148 (2013).
25. Y Cao et al., Radio frequency transistors using aligned semiconducting carbon nanotubes with current-gain cut-off frequency and maximum oscillation frequency simultaneously greater than 70 GHz, *ACS Nano* 10, 6782-6790 (2016).
26. J. Wu, A. Antaris, M. Gong, H. Dai, Top-down patterning and self-assembly for regular arrays of semiconducting single-walled carbon nanotubes, *Adv. Mater.* 26, 6151-6156 (2014).
27. D. Lee et al., Three-dimensional fin-structured semiconducting carbon nanotube network transistor, *ACS Nano* 10, 10894-10900 (2016).
28. M. M. Shulaker et al., High-performance carbon nanotube field-effect transistors, *IEEE Int. Electron Devices Meeting in San Francisco CA* 33.6.1-33.6.4 (2014).
29. Y Hu et al., Growth of high-density horizontally aligned SWNT arrays using Trojan catalysts, *Nature Commun.* 6, 6099 (2015).
30. L. Zhang et al., Assessment of chemically separated carbon nanotubes for nanoelectronics, *J. Am. Chem. Soc.* 130, 2686-2691 (2008).
31. L. Zhang et al., Optical characterizations and electronic devices of nearly pure (10,5) single-walled carbon nanotubes, *J. Am. Chem. Soc.* 131, 2454-2455 (2009).
32. A. Gopinath, P. W. K. Rothemund, Optimized assembly and covalent coupling of single-molecule DNA origami nanoarrays, *ACS Nano* 8, 12030-12040 (2014).
33. C. Qiu et al., Scaling carbon nanotube complementary transistors to 5-nm gate lengths, *Science* 355, 271-276 (2017).
34. L. Xiang et al., Low-power carbon nanotube-based integrated circuits that can be transferred to biological surfaces, *Nature Electron.* 1, 237-245 (2018).
35. C. Qiu et al., Dirac-source field-effect transistors as energy-efficient, high-performance electronic switches, *Science* 361, 387-392 (2018).
36. G. S. Tulevski et al., Toward high-performance digital logic technology with carbon nanotubes, *ACS Nano* 8, 8730-8745 (2014).
37. J. Zhang et al., Robust digital VLSI using carbon nanotubes, *IEEE Transactions on Computer-Aided Design of Integrated Circuits and Systems* 31, 453-471 (2012).

It should be noted that, the methods and devices disclosed in the embodiments of the present application can be implemented by other ways. The aforementioned device and method embodiments are merely illustrative. It should be noted that in some alternative embodiments, the steps described in the blocks can also occur in a different order as described from the figures. For example, two consecutive blocks may actually be executed substantially concurrently. Sometimes they may also be performed in reverse order, depending on the functionality.

Various embodiments have been described herein with reference to the accompanying drawings. It will, however, be evident that various modifications and changes may be made thereto, and additional embodiments may be implemented, without departing from the broader scope of the invention as set forth in the claims that follow.

What is claimed is:

1. A method for forming a nanostructure array on a substrate, comprising:
    providing a template solution comprising template nanostructures;
    depositing at least one template nanostructure onto the substrate by contacting the template solution with the substrate;
    forming on the substrate at least one fixation structure intersecting with all or a portion of the at least one template nanostructure to fix all or the portion of the at least one template nanostructure on the substrate; and
    etching the at least one template nanostructure to remove a portion of the at least one template nanostructure or contaminations.

2. The method of claim 1, wherein the template nanostructures comprise one or more substances selected from the group consisting of nucleic acid templates, decorated nucleic acid templates, protein templates, polymer templates, carbon nanotubes (CNTs), polymer-wrapped CNTs, CNT films, semiconductor nanoparticles, semiconductor nanowires, semiconductor nano-bricks, metal nanoparticles, metal nanowires, metal nano-bricks, polymeric nanoparticles, polymeric nanowires, polymeric nano-bricks, ceramic nanoparticles, ceramic nanowires, ceramic nano-bricks, metal oxide nanoparticles, metal oxide nanowires, metal oxide nano-bricks, fluoride nanoparticles, fluoride nanowires and fluoride nano-bricks.

3. The method of claim 1, wherein the template nanostructures comprise decorated nucleic acid template nanostructures each decorated with at least one nano-moiety, and providing a template solution comprising template nanostructures comprises:
    forming nucleic acid template nanostructures in the template solution, each of the nucleic acid template nanostructures comprising at least one cavity region and a non-cavity region outside of the at least one cavity region; and
    mixing at least one nano-moiety with the template solution to assemble the at least one nano-moiety into at least one cavity region of the nucleic acid template nanostructures.

4. The method of claim 3, wherein the nucleic acid template nanostructures comprise deoxyribonucleic acid (DNA) nanostructures, ribonucleic acid (RNA) nanostructures, locked nucleic acid (LNA) nanostructures, or peptide nucleic acid (PNA) nanostructure.

5. The method of claim 3, wherein the nano-moiety comprises one or more substances selected from the group consisting of carbon nanotubes (CNTs), polymer-wrapped CNTs, CNT films, semiconductor nanoparticles, semiconductor nanowires, semiconductor nano-bricks, metal nanoparticles, metal nanowires, metal nano-bricks, polymeric nanoparticles, polymeric nanowires, polymeric nano-bricks, ceramic nanoparticles, ceramic nanowires, ceramic nano-bricks, metal oxide nanoparticles, metal oxide nanowires, metal oxide nano-bricks, fluoride nanoparticles, fluoride nanowires and fluoride nano-bricks.

6. The method of claim 3, wherein the cavity region of the nucleic acid template nanostructure is formed with a first type nucleic acid brick, and the non-cavity region of the nucleic acid template nanostructure is formed with a second type nucleic acid brick which is different from the first type nucleic acid brick in nucleic acid sequence.

7. The method of claim 3, wherein forming nucleic acid template nanostructures in the template solution further comprises:
forming a first type nucleic acid handle on the at least one cavity region of the nucleic acid template nanostructure; and
wherein assembling the at least one nano-moiety onto one of the nucleic acid template nanostructures further comprises:
forming a second type nucleic acid handle on the at least one nano-moiety; and
assembling the at least one nano-moiety onto the at least one cavity region of the nucleic acid template nanostructure through interactions between the first type nucleic acid handle and the second type nucleic acid handle.

8. The method of claim 7, wherein the first type nucleic acid handle and the second type nucleic acid handle are complementary single-stranded nucleic acid strands.

9. The method of claim 3, further comprising:
etching the nucleic acid template nanostructures at their non-cavity regions.

10. The method of claim 9, wherein the nucleic acid template nanostructures are etched by carving nucleic acid strands which are complementary to nucleic acid strands at the non-cavity regions.

11. The method of claim 9, wherein etching the nucleic acid template nanostructures at their non-cavity regions comprises:
etching the nucleic acid template nanostructures to substantially even their top surfaces.

12. The method of claim 3, wherein etching the at least one template nanostructure to remove a portion of the at least one template nanostructure:
removing at least a portion of the at least one nucleic acid template nanostructure.

13. The method of claim 12, wherein the removed portion of the at least one nucleic acid template nanostructure is not covered with the at least one fixation structure before the removal step.

14. The method of claim 12, wherein the at least a portion of the nucleic acid template nanostructure is removed by a rinsing process, a thermal annealing process or a chemical oxidation process.

15. The method of claim 1, wherein depositing the at least one template nanostructures onto the substrate comprises:
forming a patterned alignment layer on the substrate, wherein the patterned alignment layer comprises a plurality of cavities;
dipping the template solution containing the template nanostructures onto the patterned alignment layer; and
incubating the substrate to diffuse the template nanostructures into the cavities.

16. The method of claim 15, wherein incubating the substrate comprises:
dehydrating or evaporating the substrate in a sealed chamber for a predetermined time period.

17. The method of claim 1, wherein the substrate comprises a semiconductor, an oxide, a nitride, a metal, a polymer, or a graphene.

18. The method of claim 1, before forming on the substrate at least one fixation structure, the method further comprising:
forming an intermediate layer on the substrate to promote adhesion of the fixation structure to the substrate.

19. The method of claim 1, wherein the at least one fixation structure have a thickness higher than 10 nm.

20. The method of claim 1, wherein the at least one fixation structure comprises a dielectric material or a metallic material.

21. The method of claim 1, wherein the template nanostructure comprises a first part for forming an electronic device and a second part which is different from the first part in material, and the method further comprises:
removing at least a portion of the second part of the template nanostructure.

22. The method of claim 1, further comprising:
forming a field effect transistor (FET) array, a sensor array, a memory unit array, or a quantum device array based on the at least one template nanostructure fixed on the substrate.

23. A nanostructure array comprising at least one nanostructure on a substrate, which is formed using the method of claim 1.

24. A method for forming a field effect transistor (FET) array on a substrate, comprising:
providing a template solution containing nucleic acid template nanostructures, wherein the nucleic acid template nanostructures are decorated with at least one nanowire;
depositing at least one nucleic acid template nanostructure decorated with the at least one nanowire onto the substrate by contacting the template solution with the substrate;
forming on the substrate at least one fixation structure each intersecting with all or a portion of the at least one nanowire to fix all or the portion of the at least one nanowire on the substrate;
removing at least a portion of the at least one nucleic acid template nanostructure which is not covered with the at least one fixation structure;
forming on the substrate a source contact and a drain contact along the at least one nanowire; and
forming a gate structure between the source contact and the drain contact and along the at least one nanowire.

25. The method of claim 24, wherein providing a template solution containing nucleic acid template nanostructures comprises:
forming the nucleic acid template nanostructures in the template solution;
mixing at least one nanowire with the template solution to assemble the at least one nanowire onto the nucleic acid template nanostructures.

26. The method of claim 25, wherein each of the nucleic acid template nanostructures comprises at least one cavity region and a non-cavity region outside of the at least one cavity region, and the at least one nanowire is assembled into at least one cavity region of the nucleic acid template nanostructures.

27. The method of claim 26, further comprising:
etching the nucleic acid template nanostructures at their non-cavity regions to substantially even their top surfaces.

28. The method of claim 24, further comprising:
removing the at least one fixation structure from the surface of the substrate.

29. The method of claim 24, wherein the nanowire comprises a carbon nanotube or a semiconductor nanowire.

30. A field effect transistor (FET) device formed using the method of claim 24, comprising:
a substrate;
a nucleic acid template-induced self-assembling nanowire formed on the substrate;

at least one fixation structure formed on the substrate and intersecting with the nanowire;

a source contact and a drain contact formed on the substrate; and a gate structure formed between the source contact and the drain contact and along the nanowire.

* * * * *